(12) United States Patent
Ogawa et al.

(10) Patent No.: US 11,659,767 B2
(45) Date of Patent: May 23, 2023

(54) PACKAGE WITH BUILT-IN THERMOELECTRIC ELEMENT

(71) Applicants: NGK SPARK PLUG CO., LTD., Nagoya (JP); FERROTEC MATERIAL TECHNOLOGIES CORPORATION, Tokyo (JP)

(72) Inventors: Masahiro Ogawa, Nagoya (JP); Tetsuya Kato, Nagoya (JP); Takayuki Hachida, Tokyo (JP)

(73) Assignees: NGK SPARK PLUG CO., LTD., Nagoya (JP); FERROTEC MATERIAL TECHNOLOGIES CORPORATION, Tokyo (JP)

( * ) Notice: Subject to any disclaimer, the term of this patent is extended or adjusted under 35 U.S.C. 154(b) by 68 days.

(21) Appl. No.: 16/485,729

(22) PCT Filed: Feb. 14, 2018

(86) PCT No.: PCT/JP2018/005139
§ 371 (c)(1),
(2) Date: Aug. 13, 2019

(87) PCT Pub. No.: WO2018/151176
PCT Pub. Date: Aug. 23, 2018

(65) Prior Publication Data
US 2020/0006617 A1 Jan. 2, 2020

(30) Foreign Application Priority Data
Feb. 15, 2017 (JP) .............................. JP2017-026439

(51) Int. Cl.
*H10N 10/17* (2023.01)
*H10N 10/82* (2023.01)
*H10N 10/817* (2023.01)

(52) U.S. Cl.
CPC ........... *H10N 10/17* (2023.02); *H10N 10/817* (2023.02); *H10N 10/82* (2023.02)

(58) Field of Classification Search
CPC ......... H01L 35/04; H01L 35/08; H01L 35/10; H01L 35/30; H01L 35/32; H01L 35/325;
(Continued)

(56) References Cited

U.S. PATENT DOCUMENTS 6,043,982 A 3/2000 Meissner
7,911,059 B2 * 3/2011 Cheng ................... H01L 33/641
257/758
(Continued)

FOREIGN PATENT DOCUMENTS

CN 101989596 B * 10/2012
JP H10-090077 A 4/1998
(Continued)

OTHER PUBLICATIONS

CN-101989596-B English Machine Translation (Year: 2012).*
(Continued)

*Primary Examiner* — Andrew J Golden
(74) *Attorney, Agent, or Firm* — Stites & Harbison, PLLC; Jeffrey A. Haeberlin; Gary N. Stewart

(57) ABSTRACT

A thermoelectric element-containing package according to one aspect of the present disclosure includes a thermoelectric conversion module including: a first substrate having first and second main surfaces; a second substrate having third and fourth main surfaces; and a plurality of thermoelectric elements that are sandwiched between the first and second substrates and arranged along the second main surface and the third main surface. The thermoelectric element-containing package further includes: a frame joined to the first and second substrates so as to form a hermetically sealed space surrounding the plurality of thermoelectric
(Continued)

elements and disposed between the first substrate and the second substrate; and a placement member that is disposed on the first main surface of the first substrate or the fourth main surface of the second substrate and to which an additional device is to be connected.

7 Claims, 16 Drawing Sheets

(58) Field of Classification Search
CPC ....... H01L 35/34; H01L 23/38; H01L 33/645; H01L 25/167; H01L 27/16; H10N 10/00; H10N 10/17; H10N 10/817; H10N 10/82
USPC .................................. 136/200–242
See application file for complete search history.

(56) References Cited

U.S. PATENT DOCUMENTS

| | | | |
|---|---|---|---|
| 2005/0016183 A1* | 1/2005 | Tateyama | H01L 35/32 62/3.7 |
| 2006/0243317 A1* | 11/2006 | Venkatasubramanian | H01L 35/30 136/206 |
| 2007/0028955 A1 | 2/2007 | Sogou et al. | |
| 2008/0006843 A1* | 1/2008 | Dai | H01L 25/167 257/99 |
| 2009/0032080 A1* | 2/2009 | Kawauchi | H01L 35/34 136/224 |
| 2010/0101619 A1 | 4/2010 | Sogou et al. | |
| 2010/0108117 A1* | 5/2010 | Hamano | H01L 35/32 136/241 |
| 2010/0163090 A1* | 7/2010 | Liu | H01L 35/32 136/224 |
| 2011/0220955 A1* | 9/2011 | Park | H01L 35/00 257/99 |
| 2011/0316024 A1* | 12/2011 | Hung | H01L 33/647 257/98 |
| 2012/0201008 A1* | 8/2012 | Hershberger | H01L 35/30 361/720 |
| 2013/0168798 A1* | 7/2013 | Chang | H01L 23/38 257/467 |

FOREIGN PATENT DOCUMENTS

| | | |
|---|---|---|
| JP | 2002-510864 A | 4/2002 |
| JP | 2003-347607 A | 12/2003 |
| JP | 2007-110082 A | 4/2007 |

OTHER PUBLICATIONS

Japan Patent Office, International Search Report issued in corresponding Application No. PCT/JP2018/005139, dated Apr. 10, 2018.

* cited by examiner

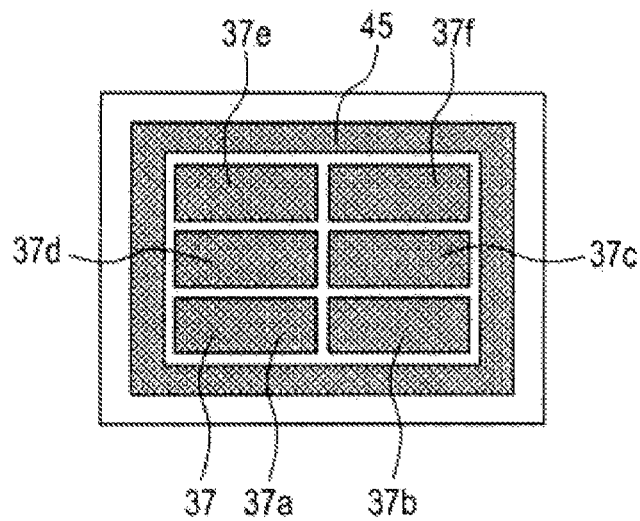
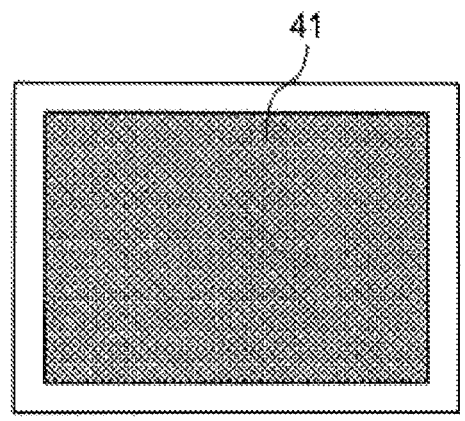
FIG. 5A          FIG. 5B
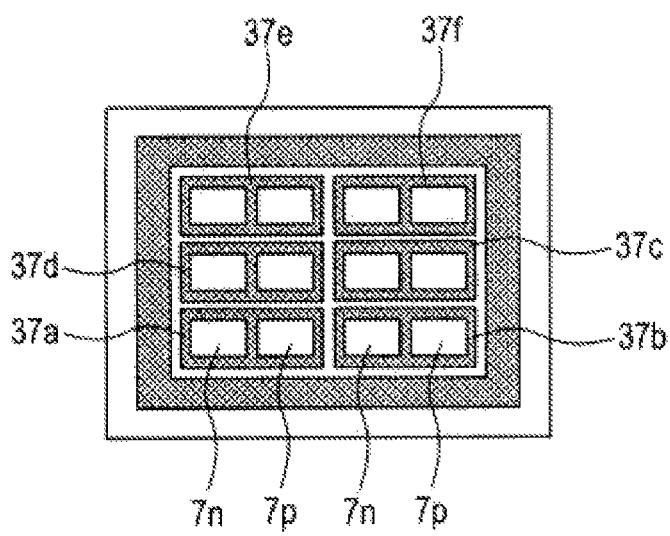
FIG. 5C

PACKAGE WITH BUILT-IN THERMOELECTRIC ELEMENT

CROSS REFERENCE TO RELATED APPLICATION

This international patent application claims priority from Japanese Patent Application No. 2017-26439 filed with the Japanese Patent Office on Feb. 15, 2017, and the entire contents of Japanese Patent Application No. 2017-26439 are incorporated by reference in this international application.

TECHNICAL FIELD

The present disclosure relates to a package with built-in thermoelectric element (hereinafter referred to as a "thermoelectric element-containing package") applicable to, for example, devices that use thermoelectric elements (i.e., thermoelectric conversion elements) to cool a heat-generating element or control its temperature, such as a package on which a semiconductor laser element (LD: Laser Diode) or LED (Light Emitting Diode) is mounted (e.g., a package for optical communications and a package for lighting use) and a CMOS package.

BACKGROUND ART

Conventional thermoelectric conversion modules that use thermoelectric conversion elements using the Peltier effect have simple structures, can be handled with ease, can maintain their properties stably, and are therefore expected to be used in a wide variety of applications.

In particular, since the thermoelectric conversion modules can be used for local cooling and precise control of temperature around room temperature, they are used, for example, for compact refrigerators and devices, typified by semiconductor lasers, optical integrated circuits, etc., whose temperatures are precisely controlled to predetermined temperatures.

Patent Document 1 discloses a technique for such thermoelectric conversion modules.

As shown in FIG. 21, in this technique, wiring conductors P3 and P4 are formed on surfaces of insulating substrates P1 and P2, respectively, and a plurality of thermoelectric conversion elements P7 including N-type thermoelectric conversion elements P5 and P-type thermoelectric conversion elements P6 are held between the insulating substrates P1 and P2 and soldered to the wiring conductors P3 and P4.

The N-type thermoelectric conversion elements P5 and the P-type thermoelectric conversion elements P6 are electrically connected in series through the wiring conductors P3 and P4 and are connected to external connection terminals P8. External wiring lines P10 are connected to the external connection terminals P8 using solder P9, and electric power is supplied through the external wiring lines P10 to the thermoelectric conversion elements P7.

PRIOR ART DOCUMENT

Patent Document

Patent Document 1: Japanese Patent Application Laid-Open (kokai) No. 2003-347607

SUMMARY OF THE INVENTION

Problems to be Solved by the Invention

In the above conventional thermoelectric conversion module, one of the insulating substrates becomes hot, and the other insulating substrate becomes cold. If the temperature of the low-temperature-side insulating substrate is excessively low, dew condensation may occur on the thermoelectric conversion elements themselves. In this case, a short circuit may occur in the electrically connected portions etc., causing corrosion of the conductive members such as the wiring conductors. Moreover, the thermoelectric conversion elements themselves absorb moisture. In this case, the thermoelectric conversion elements may fail to exhibit their properties sufficiently.

Preferably, one aspect of the present disclosure provides a thermoelectric element-containing package in which the occurrence of dew condensation can be prevented.

Means for Solving the Problems (1) A thermoelectric element-containing package in one aspect of the present disclosure includes a thermoelectric conversion module. The thermoelectric conversion module includes a first substrate that has a first main surface and a second main surface opposite to the first main surface and is formed of an insulating material; a second substrate that has a third main surface and a fourth main surface opposite to the third main surface and is formed of an insulating material, the second substrate being disposed such that the third main surface faces the second main surface; and a plurality of thermoelectric elements that are sandwiched between the first substrate and the second substrate and arranged along the second main surface and the third main surface.

The thermoelectric element-containing package further includes a frame that is joined to the first substrate and the second substrate so as to form a hermetically sealed space surrounding the plurality of thermoelectric elements between the first substrate and the second substrate; and a placement member that is disposed on the first main surface of the first substrate or the fourth main surface of the second substrate and to which an additional device is to be connected.

Namely, the plurality of thermoelectric elements are disposed in the hermetically sealed space (i.e., a closed space) surrounded by the frame between the first substrate and the second substrate. This gives the effect that, even when electric power is supplied to the thermoelectric elements and the temperature of the first substrate or the second substrate becomes lower than the ambient temperature, dew condensation is unlikely to occur in the hermetically sealed space.

This is advantageous in that a short circuit is unlikely to occur between electrically connected portions and that corrosion is unlikely to occur in conductive members such as wiring conductors. Another advantage is that, since water absorption by the thermoelectric elements is prevented, the properties of the thermoelectric elements are unlikely to deteriorate.

Further, in this thermoelectric element-containing package, the first substrate includes an inner conductive trace that is disposed on the second main surface and connected to the thermoelectric elements, an outer conductive trace that is disposed on the first main surface and exposed to the outside, an embedded conductive trace that is embedded in the first substrate and connected to the outer conductive trace, and a first via conductor that penetrates the first substrate so as to extend between the inner conductive trace and the embedded conductive trace, the first via conductor electrically connecting the inner conductive trace to the embedded conductive trace.

Namely, in this thermoelectric element-containing package, the inner conductive trace connected to the thermoelectric elements is connected to the embedded conductive trace through the first via conductor, and the embedded conductive trace is connected to the outer conductive trace exposed to the outside.

Since an external wiring line for supplying electric power can be connected to the exposed outer conductive trace exposed on the outer side of the first substrate (i.e., at the first main surface) by, for example, solder, the external wiring line can be easily connected. Therefore, the cost of production can be reduced.

Since the outer conductive trace is formed on the first main surface, i.e., on the surface on the side (outer side) opposite to the side (inner side) where the thermoelectric elements are disposed, the outer structures (i.e., the outer conductive trace and the external wiring line) do not interfere with the inner structures (i.e., the thermoelectric elements and the inner conductive trace). This is advantageous in that less constraints are imposed on the arrangement of the outer conductive trace and the external wiring line.

Unlike conventional cases, it is unnecessary to increase the area of the substrates (i.e., their footprint) in order to provide a sufficient region for disposing an external connection terminal for connecting the external wiring line. This is advantageous in that the first substrate and the second substrate can be reduced in size.

It is only necessary that the first via conductor be disposed so as to be connected to the inner conductive trace and the embedded conductive trace. This is advantageous in that the degree of flexibility of the arrangement of the first via conductor increases. Moreover, the outer conductive trace can be disposed irrespective of the arrangement of the first via conductor, so long as the outer conductive trace is connected to the embedded conductive trace. This is advantageous in that the degree of flexibility of the arrangement of the outer conductive trace increases.

(2) In the above-described thermoelectric element-containing package, the first substrate may include a second via conductor that penetrates the first substrate so as to extend between the embedded conductive trace and the outer conductive trace, the second via conductor electrically connecting the embedded conductive trace to the outer conductive trace.

As described above, the embedded conductive trace embedded in the first substrate may be connected through the second via conductor to the outer conductive trace on the outer side of the first substrate in the thickness direction (on the first main surface side).

In this case, since the external wiring line for supplying electric power can be connected to the outer conductive trace exposed at the outer side of the first substrate by, for example, solder, the external wiring line can be easily connected. Therefore, the cost of production can be reduced.

It is only necessary that the embedded conductive trace be connected to the outer conductive trace through the second via conductor extending in the thickness direction of the first substrate. This is advantageous in that the outer conductive trace can be formed at any position in plane directions (i.e., directions perpendicular to the thickness direction).

(3) In the above-described thermoelectric element-containing package, the first substrate may have a lowered portion that is recessed toward the plurality of thermoelectric elements and located in an outer circumferential portion of the first main surface, and the outer conductive trace may be disposed on a surface of the lowered portion.

Namely, this thermoelectric element-containing package may include the lowered portion formed in the outer circumferential portion of the first main surface of the first substrate so as to be recessed toward the plurality of thermoelectric elements, i.e., to be lowered toward the plurality of thermoelectric elements. Therefore, the space outside the lowered portion (on the side opposite to the plurality of thermoelectric elements) is open in outward and lateral directions. The outer conductive trace may be disposed on the surface (outer surface) of the lowered portion.

In this case, the outer conductive trace is formed on the surface of the lowered portion. Therefore, even after the external wiring line is connected to the outer conductive trace, the external wiring line is unlikely to protrude outward from the surface of a non-recessed portion of the first substrate. This is advantageous in that the external wiring line is unlikely to interfere with other members. Another advantage is that, when, for example, the placement member is disposed on the first substrate and the device is disposed on a wiring portion of the placement member, the external wiring line is unlikely to interfere with the device and lead wires connected to the device.

Other advantages are as follows. In the case where the external wiring line is connected to the outer conductive trace through use of a conductive bonding material such as solder, it is possible to prevent the conductive bonding material from coming into contact with the placement member on the first substrate, which would otherwise occur due to flow of the conductive bonding material. Also, it is possible to prevent formation of a short circuit between the external wiring line and the device etc. mounted on the placement member due to adhesion of foreign matter.

(4) In the above-described thermoelectric element-containing package, when the placement member is disposed on the first substrate, the first substrate may have a protruding portion that is formed in a position farther from the plurality of thermoelectric elements than the placement member, and the outer conductive trace may be disposed on a surface of the protruding portion.

Namely, the thermoelectric element-containing package may include the protruding portion disposed on the outer side of the first substrate (i.e., the side opposite to the plurality of thermoelectric elements) so as to protrude outward from the placement member, and the outer conductive trace may be disposed on the surface (i.e., on the outer surface) of the protruding portion.

As described above, the outer conductive trace is disposed on the protruding portion. In this case, even after the external wiring line is connected to the outer conductive trace, the connection portion between the outer conductive trace and the external wiring line is located higher than (on the outer side of) the placement member formed on the outer side of the first substrate. Therefore, in this case, the distance between the placement member and the external wiring line etc. can be sufficiently lager than that when the placement member and the outer conductive trace are located at the same height.

This is advantageous in that, even after the device is disposed on the placement member, the external wiring line is unlikely to interfere with the device and the lead wires connected to the device.

Other advantages are as follows. In the case where the external wiring line is connected to the outer conductive trace through use of a conductive bonding material such as solder, it is possible to prevent the conductive bonding material from coming into contact with the placement member, which would otherwise occur due to flow of the conductive bonding material. Also, it is possible to prevent formation of a short circuit between the external wiring line and the device etc. mounted on the placement member due to adhesion of foreign matter.

(5) In the above-described thermoelectric element-containing package, the first substrate, the second substrate, and the frame may be formed of the same material.

In this case, components such as the first substrate, the second substrate, and the frame have the same coefficient of thermal expansion (the same thermal expansion coefficient). Therefore, even when temperature changes, thermal stress is unlikely to act on the joint portions of the first substrate, the second substrate, and the frame, so that deformation and breakage due to the thermal stress can be prevented.

(6) In the above-described thermoelectric element-containing package, the thermal conductivity of the frame may be smaller than the thermal conductivity of the first substrate and the thermal conductivity of the second substrate.

In this case, heat is less transferred through the frame than through the first substrate and the second substrate. When the difference in temperature between the first substrate and the second substrate is increased upon energization of the thermoelectric elements, it is possible to prevent a reduction in the temperature difference.

(7) In the above-described thermoelectric element-containing package, the material of the frame may be an iron-based alloy with nickel and cobalt, such as KOVAR™.

The thermal conductivity of KOVAR™ alloy is close to the thermal conductivity of ceramic materials (e.g., alumina). When the first substrate and the second substrate are formed of a ceramic material (e.g., alumina) and the frame is formed of KOVAR™ alloy, the thermal expansion coefficients of these members are approximately the same. Therefore, even when temperature changes, thermal stress is unlikely to act on the joint portions of the first substrate, the second substrate, and the frame, so that deformation and breakage due to the thermal stress can be prevented.

One advantage of KOVAR™ alloy is that joining of KOVAR™ alloy is easier than joining of the ceramic. For example, KOVAR™ alloy can be joined without metallizing treatment, and this is advantageous in that the joining step can be simplified.

(8) In the above-described thermoelectric element-containing package, the second substrate may have a side surface bordering the third main surface and the fourth main surface, and the side surface of the second substrate may be surrounded by the frame and joined to an inner circumferential surface of the frame.

In this case, since the frame is not disposed between the first substrate and the second substrate, the thermoelectric elements can be reliably in contact with (i.e., can be joined to) the first substrate and the second substrate without being restricted by the height dimension of the frame (i.e., its dimension in the thickness direction of the substrates).

(9) In the above-described thermoelectric element-containing package, the second substrate may include an additional inner conductive trace that is disposed on the third main surface and connected to the thermoelectric elements; an additional outer conductive trace disposed on the fourth main surface so as to be exposed to the outside; an additional embedded conductive trace that is embedded in the second substrate and connected to the additional outer conductive trace; and a third via conductor that penetrates the second substrate so as to extend between the additional inner conductive trace and the additional embedded conductive trace, the third via conductor electrically connecting the additional inner conductive trace to the additional embedded conductive trace.

Namely, a structure similar to the structure of the first substrate can be used as the structure of the second substrate. Therefore, structural elements such as the lowered portion, the protruding portion, and the second via conductor may be provided in the second substrate.

<Next, the Structural Elements of the Present Disclosure will be Described>

The main surfaces (i.e., the first to fourth main surfaces) of a plate-shaped member are its surfaces extending in a direction perpendicular to the thickness direction of plate-shaped member.

The insulating material is an electrically insulating material, and the first substrate and the second substrate formed of the insulating material have electrical insulating properties.

The first substrate and the second substrate may each be a ceramic substrate containing a ceramic as a main component (in an amount of more than 50% by volume). The ceramic used may be alumina, aluminum nitride, glass ceramic, silicon nitride, etc.

Each thermoelectric element is a thermoelectric conversion element (i.e., a Peltier element) that, when electric power is supplied, absorbs heat on one side and generates heat on the other side.

The frame may be a ceramic-made frame containing a ceramic as a main component (in an amount of more than 50% by volume) or a frame made of KOVAR™ alloy. The ceramic used may be alumina, glass ceramic, silicon nitride, etc.

The inner conductive trace, the outer conductive trace, the embedded conductive trace, and the vias (i.e., the via conductors) are formed of an electrically conductive material (conductive material). Examples of the conductive material include tungsten (W), molybdenum (Mo), silver (Ag), and copper (Cu).

The device is an apparatus or a device (e.g., an electronic component or an electronic device) whose temperature is controlled (e.g., which is cooled) by the thermoelectric element-containing package. "The additional device" is a device other than the thermoelectric element-containing package.

The placement member is a portion (part) on which the device is to be placed, for example, in contact therewith.

BRIEF DESCRIPTION OF THE DRAWINGS

FIG. 4 shows the first substrate viewed in the thickness direction (in plan view viewed from above in FIG. 2).

FIG. 5 shows the second substrate viewed in the thickness direction (in plan view viewed from above in FIG. 2). FIG. 5A is an illustration showing the arrangement of traces on the inner main surface of the second substrate, and FIG. 5B is an illustration showing the arrangement of a front-side conductor on the outer main surface of the second substrate. FIG. 5C is an illustration showing the arrangement of the thermoelectric elements disposed on the inner conductive traces.

Figure 1:
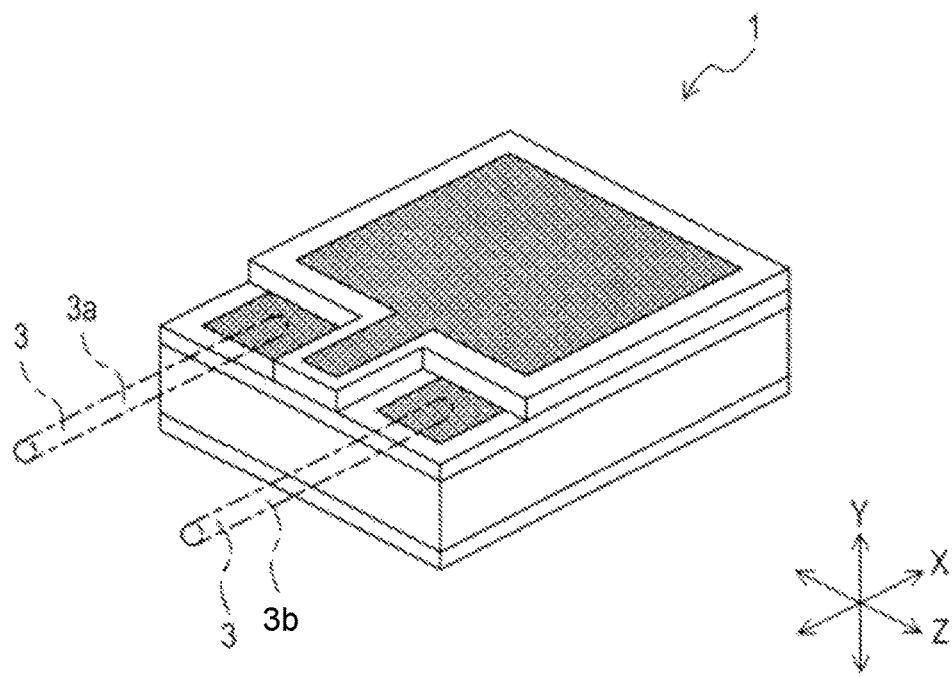
FIG. 1 is a perspective view of a thermoelectric element-containing package of a first embodiment.

DESCRIPTION OF REFERENCE NUMERALS 1, 101, 111, 121, 141, 161, 181, 191 thermoelectric element-containing package
5, 113, 123, 143, 163, 205 first substrate
7 thermoelectric element
9, 129, 221 second substrate
11 thermoelectric conversion module
13a hermetically sealed space
19, 131 frame
23 semiconductor element
25, 118 back-side conductor
29, 117, 127, 147, 167, 203, 225 outer conductive trace
31 embedded conductive trace
33, 37, 229 inner conductive trace
35, 103, 119, 195, 201, 211, 231 via
193 ceramic edge layer

MODES FOR CARRYING OUT THE INVENTION

Embodiments to which the present disclosure is applied will be described using the drawings.

1. First Embodiment

[1-1. Overall Structure]

As shown in FIG. 1, a thermoelectric element-containing package 1 of a first embodiment has an approximately cuboidal shape (i.e., a plate shape) and has the following function based on the so-called Peltier effect. When electric power (i.e., a DC current) is supplied to the thermoelectric element-containing package 1 from the outside through external wiring lines 3 (3a and 3b), one of the main surfaces in the Y direction (e.g., an upper surface), for example, absorbs heat, and the other main surface (i.e., a lower surface) generates heat.

Figure 2:
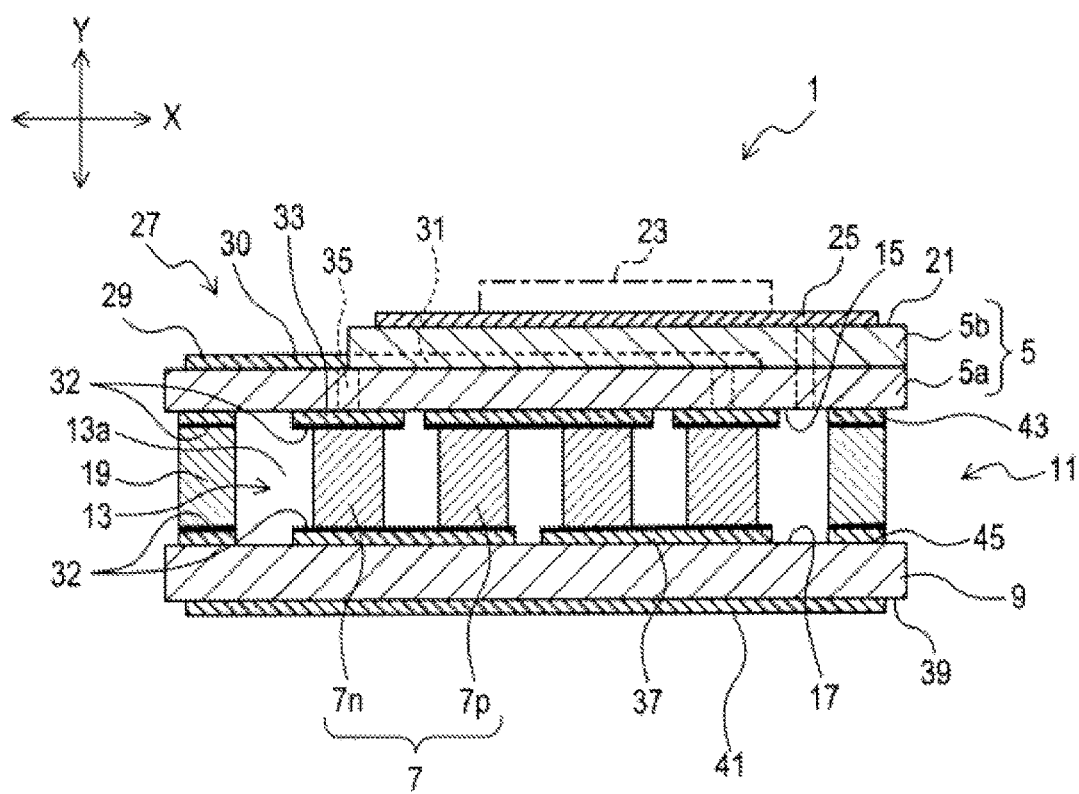
FIG. 2 is a cross-sectional view schematically showing the thermoelectric element-containing package of the first embodiment cut in its thickness direction along the XY plane.

As shown in FIG. 2, the thermoelectric element-containing package 1 includes a thermoelectric conversion module 11 including: an electrically insulating first substrate (insulating back-side substrate) 5; a plurality of thermoelectric elements 7 arranged along a surface of the first substrate 5; and an electrically insulating second substrate (insulating front-side substrate) 9 that faces the first substrate 5 with the plurality of thermoelectric elements 7 disposed therebetween.

Specifically, in the thermoelectric element-containing package 1, the plurality of thermoelectric elements 7 are disposed in a flat plate-shaped space 13 sandwiched between the first substrate 5 and the second substrate 9, i.e., a space 13 extending in XZ directions, and arranged in plane directions along the XZ plane.

The thermoelectric elements 7 are cuboidal thermoelectric conversion elements (i.e., Peltier elements) and include N-type thermoelectric conversion elements 7n and P-type thermoelectric conversion elements 7p.

A frame 19 having a rectangular shape in plan view as viewed in the Y direction (i.e., a rectangular planer shape) is joined between an inner main surface 15 (i.e., a second main surface on the side toward the thermoelectric elements 7) of the first substrate 5 and an inner main surface 17 (i.e., a third main surface on the side toward the thermoelectric elements 7) of the second substrate 9. Specifically, the first substrate 5, the second substrate 9, and the frame 19 form a hermetically sealed space 13a (see FIG. 3) having a rectangular shape in plan view and isolated from the outside, and all the thermoelectric elements 7 are disposed in the hermetically sealed space 13a.

Since the frame 19 is joined along the outer circumferential edge of the first substrate 5 and the outer circumferential edge of the second substrate 9, all the thermoelectric elements 7 are surrounded by the frame 19 from the outer circumferential side in the XZ plane.

A back-side conductor 25 used as a placement member to which an additional device such as a semiconductor element 23 is to be connected is provided on an outer main surface 21 (i.e., a first main surface on the side opposite to the thermoelectric elements 7) of the first substrate 5.

The first substrate 5 includes an inner ceramic layer 5a on the lower side in FIG. 2 and an outer ceramic layer 5b on the upper side in FIG. 2.

A pair of lowered portions 27 (27a and 27b: see FIG. 3) recessed (i.e., lowered) inward (toward the lower side in FIG. 2) from part of the surface on which the back-side conductor 25 is formed are formed on part of the outer main surface 21 (i.e., part of the outer circumference) of the first substrate 5. Spaces on the outer side (namely, on the upper side in FIG. 2) of the lowered portions 27 are open in outward and lateral directions of the first substrate 5. Specifically, the pair of lowered portions 27 are formed by cutting portions (corners) of the outer circumferential portion of the outer ceramic layer 5b such that the thickness of the first substrate 5 is reduced and the inner ceramic layer 5a on the lower side is partially exposed.

A pair of outer conductive traces 29 (29a and 29b: see FIG. 3) are formed on the outer surfaces of the pair of lowered portions 27 (i.e., portions of a surface of the inner ceramic layer 5a) so as to be exposed to the outside.

A pair of embedded conductive traces 31 (31a and 31b: see FIG. 4) are embedded in the first substrate 5, i.e., between the inner ceramic layer 5a and the outer ceramic layer 5b.

The embedded conductive trace 31a is electrically connected to the outer conductive trace 29a, and the embedded conductive trace 31b is electrically connected to the outer conductive trace 29b. Specifically, the pair of embedded conductive traces 31 and the pair of outer conductive traces 29 form a pair of integrated conductive traces 30 (30a and 30b: see FIG. 4).

Inner conductive traces 33 are disposed on the inner main surface 15 of the first substrate 5 so as to be connected to first ends (namely, upper ends in FIG. 2) of the thermoelectric elements 7.

Moreover, vias (i.e., first conductor vias) 35 passing through the inner ceramic layer 5a of the first substrate 5 in the thickness direction (i.e., the vertical direction in FIG. 2) are formed so as to connect inner conductive traces 33 to the embedded conductive traces 31.

The upper surfaces (i.e., the upper surfaces in FIG. 2) of the thermoelectric elements 7 are joined to the inner conductive traces 33 on the first substrate 5 through a bonding material 32 composed of, for example, a solder material, and the upper surface of the frame 19 is joined to a metal layer 43 (see FIG. 4B) on the inner main surface 15 of the first substrate 5 similarly through the bonding material 32.

Inner conductive traces 37 are formed on the inner main surface 17 of the second substrate 9 so as to be connected to second ends (i.e., lower ends in FIG. 2) of the thermoelectric elements 7. Moreover, a front-side conductor 41 is provided on an outer main surface 39 (i.e., a fourth main surface on the side opposite to the thermoelectric elements 7) of the second substrate 9.

The lower surfaces (namely, the lower surfaces in FIG. 2) of the thermoelectric elements 7 are joined to the inner conductive traces 37 on the second substrate 9 similarly through the bonding material 32, and the lower surface of the frame 19 is joined to a metal layer 45 (see FIG. 5A) on the inner main surface 17 of the second substrate 9 similarly through the bonding material 32.

Figure 3:
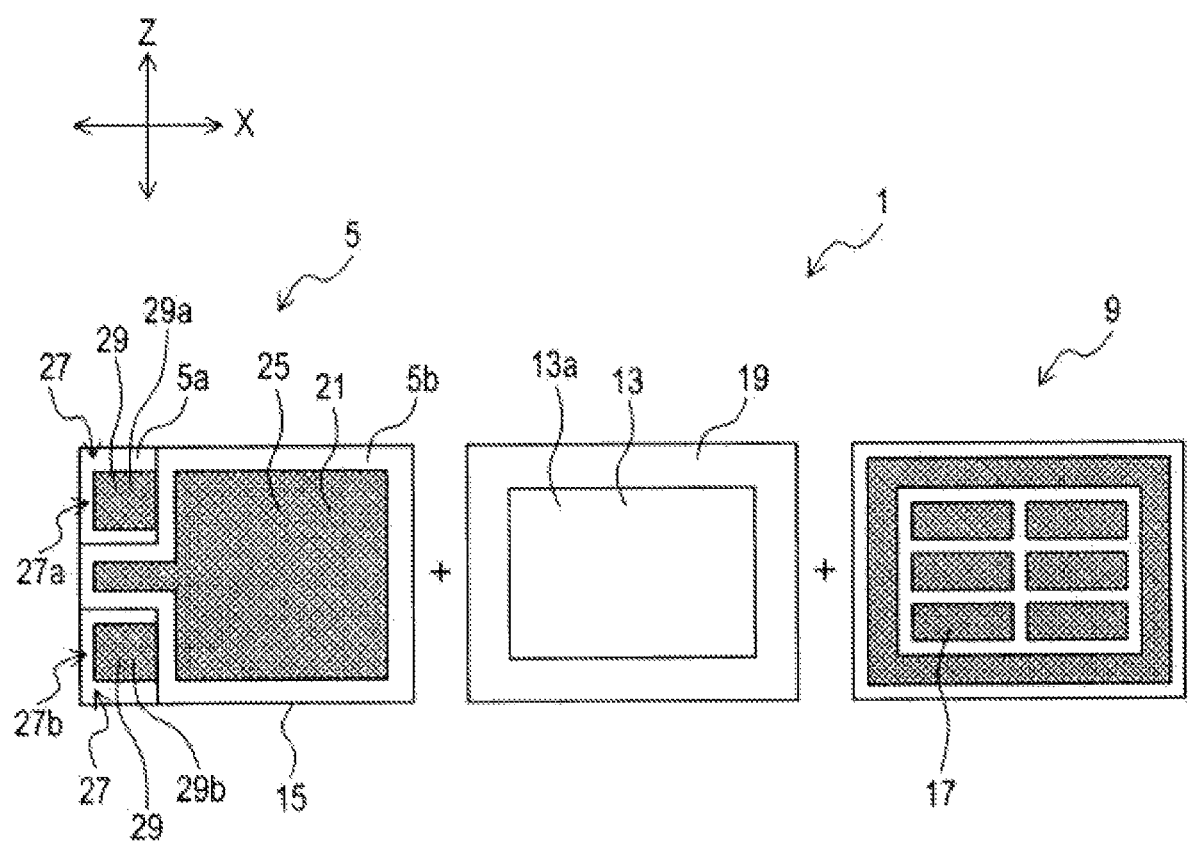
FIG. 3 is an illustration showing the planar shapes and arrangement of a first substrate, a frame, and a second substrate.

As shown in the leftmost illustration of FIG. 3, the outer ceramic layer 5b in plan view has a convex shape located between the pair of lowered portions 27. The convex shape is formed by partially removing, by cutting, opposite ends of a portion of the outer ceramic layer 5b on one side (i.e., the side on which the external wiring lines 3 are to be connected: the left side in FIG. 3), i.e., portions corresponding to the pair of lowered portions 27. The outer conductive traces 29 are formed on the surfaces of the exposed portions of the inner ceramic layer 5a in the lowered portions 27, and the external wiring lines 3 are to be joined to the outer conductive traces 29 by, for example, solder (not shown).

The first and second substrates 5 and 9 are electrically insulating ceramic substrates formed of an insulating material such as alumina, and the frame 19 is a ceramic member formed of a similar material. The embedded conductive traces 31, the outer conductive traces 29, the inner conductive traces 33 and 37, the vias 35, the back-side conductor 25, and the front-side conductor 41 are conductive members formed of a conductive material such as tungsten.

[1-2. First Substrate]

Next, the first substrate 5 will be described with reference to FIG. 4. Hatched portions in FIGS. 4A to 4D show the planar shapes of conductive portions when they are viewed from above in FIG. 2 (hidden portions are illustrated as they are seen through the substrate).

Figure 4A:
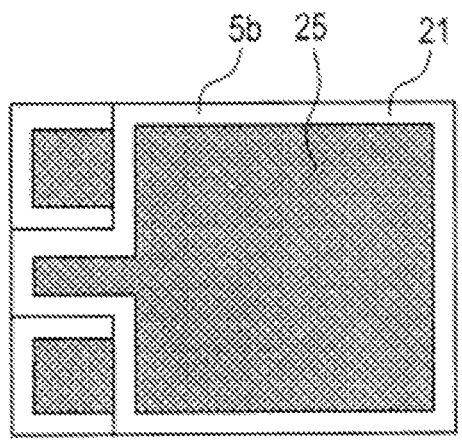
FIG. 4A is a plan view showing the shape etc. on the outer main surface side of the first substrate.

As shown in FIG. 4A, the outer ceramic layer 5b has a planar shape with a protrusion, and the back-side conductor 25 having a planar shape with a protrusion is formed on the outer main surface 21 of the outer ceramic layer 5b. Specifically, the back-side conductor 25 is formed on a central portion of the outer ceramic layer 5b except for a strip-shaped portion extending along the outer circumference of the outer ceramic layer 5b.

Figure 4B:
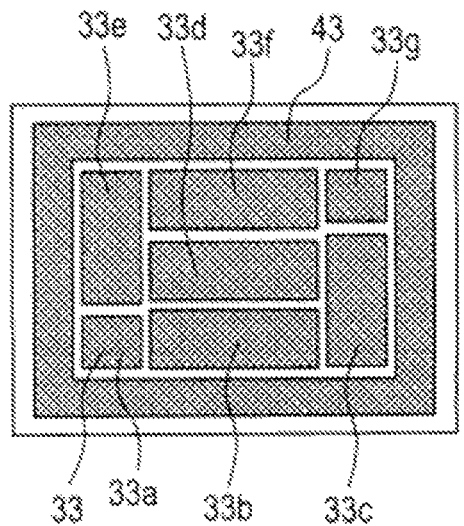
FIG. 4B is an illustration showing the arrangement of traces on the inner main surface side of the first substrate.

As shown in FIG. 4B, the metal layer 43 having a rectangular frame shape and to be joined to the frame 19 is formed on the inner main surface 15 of the first substrate 5 (i.e., of the inner ceramic layer 5a).

The inner conductive traces 33 to be connected to the thermoelectric elements 7 are formed in a central portion surrounded by the metal layer 43. The inner conductive traces 33 include first, second, third, fourth, fifth, sixth, and seventh inner conductive traces 33a, 33b, 33c, 33d, 33e, 33f, and 33g disposed so as to be separated from each other.

Figure 4C:
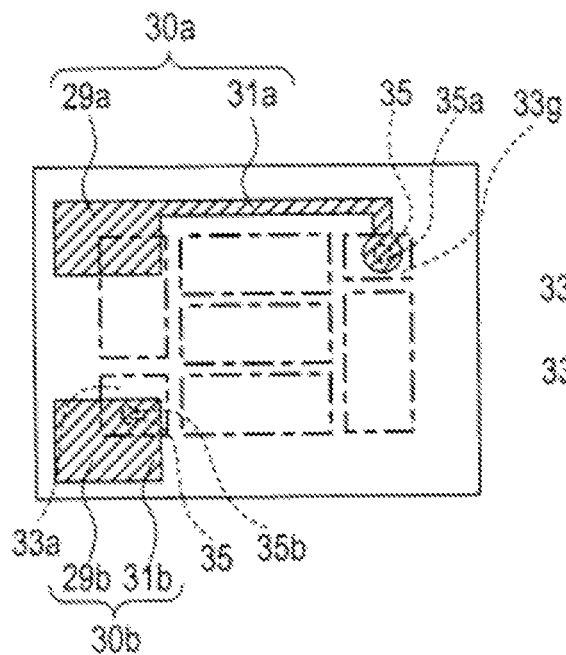
FIG. 4C is an illustration showing the arrangement of embedded conductive traces.

As shown in FIG. 4C, in the integrated conductive trace 30a, the embedded conductive trace 31a extends linearly to the right from the outer conductive trace 29a, and an end of the embedded conductive trace 31a is connected to a via 35a. The via 35a is connected to the seventh inner conductive trace 33g.

The integrated conductive trace 30b is connected to a via 35b. The via 35b is connected to the first inner conductive trace 33a.

Figure 4D:
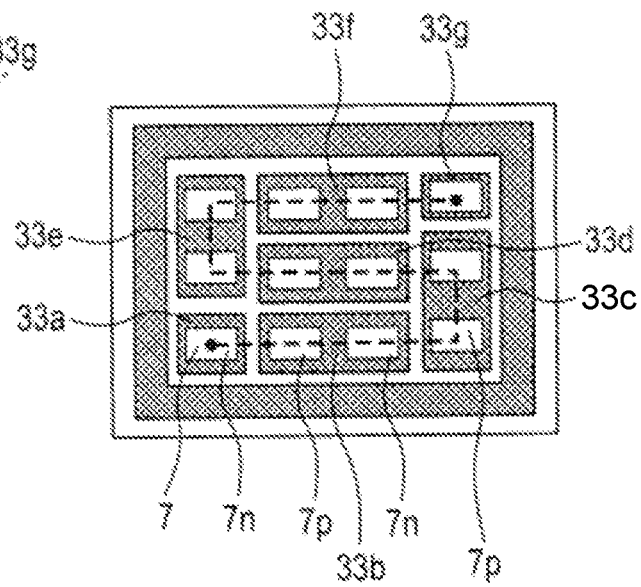
FIG. 4D is an illustration showing the arrangement of thermoelectric elements disposed on the inner conductive traces.

As shown in FIG. 4D, twelve thermoelectric elements 7 are arranged along a dotted line in FIG. 4D and electrically connected in series through the inner conductive traces 33 and 37.

More specifically, an N-type thermoelectric conversion element 7n is disposed on the first inner conductive trace 33a, and a P-type thermoelectric conversion element 7p and another N-type thermoelectric conversion element 7n are disposed on the second inner conductive trace 33b along the dotted line in this order. Similarly, a P-type thermoelectric conversion element 7p and an N-type thermoelectric conversion element 7n are disposed in this order on each of the third to sixth inner conductive traces 33c to 33f, and a P-type thermoelectric conversion element 7p is disposed on the seventh inner conductive trace 33g.

[1-3. Second Substrate]

Next, the second substrate 9 will be described with reference to FIG. 5. Hatched portions in FIGS. 5A to 5D show the planar shapes of conductive portions when they are viewed from above in FIG. 2 (hidden portions are illustrated as they are seen through the substrate).

As shown in FIG. 5A, the metal layer 45 having a rectangular frame shape and to be joined to the frame 19 is formed on the inner main surface 17 of the second substrate 9.

The inner conductive traces 37 to be connected to the thermoelectric elements 7 are formed in a central portion surrounded by the metal layer 45. The inner conductive traces 37 include first, second, third, fourth, fifth, and sixth inner conductive traces 37a, 37b, 37c, 37d, 37e, and 37f disposed so as to be separated from each other.

As shown in FIG. 5B, the front-side conductor 41 having a rectangular planer shape is formed on the outer main surface 39 of the second substrate 9. Specifically, the front-side conductor 41 is formed on a central portion of the outer main surface 39 except for a strip-shaped portion extending along the outer circumference of the outer main surface 39.

As shown in FIG. 5C, the twelve thermoelectric elements 7 are arranged as shown in FIG. 4D and are connected to the inner conductive traces 37a to 37f.

More specifically, an N-type thermoelectric conversion element 7n and a P-type thermoelectric conversion element 7p are connected in this order to each of the first to sixth inner conductive traces 37a to 37f along the dotted line in FIG. 4D.

As is well known, when the direction of the applied current is reversed, the heat absorption side and the heat generation side are reversed. Therefore, when the outer side of the second substrate 9 (i.e., the front-side conductor 41 side) is set to the heat absorption side, a device such as a semiconductor element may be disposed on the front-side conductor 41 side.

Different devices (for example, a device to be heated and a device to be cooled) may be disposed on the back-side conductor 25 on the first substrate 5 and the front-side conductor 41 on the second substrate 9, respectively, according to the types of devices.

[1-4. Method for Producing Thermoelectric Element-Containing Package]

Figure 6:
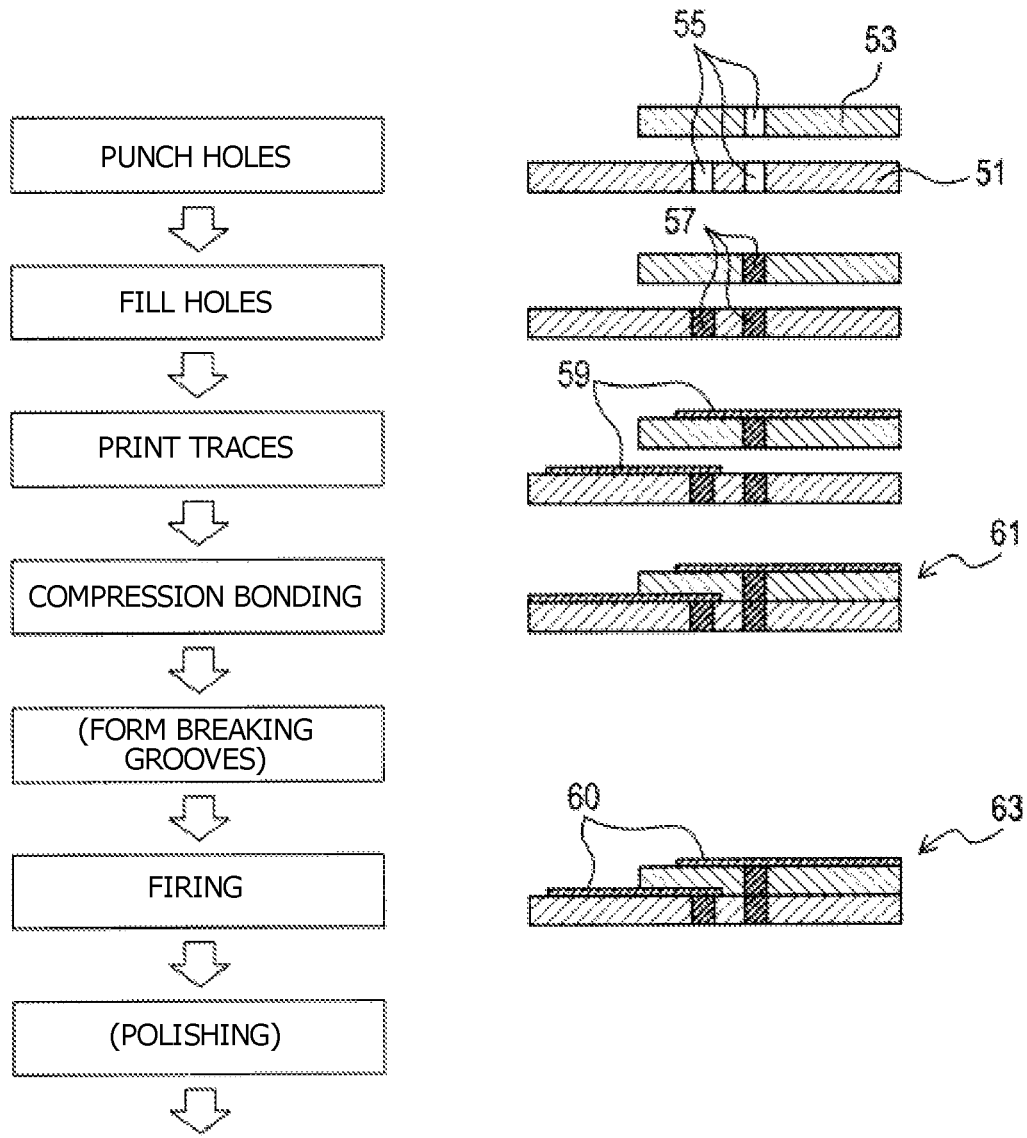
FIG. 6 shows illustrations of part of a first substrate production process in a thermoelectric element-containing package production process.
Figure 7:
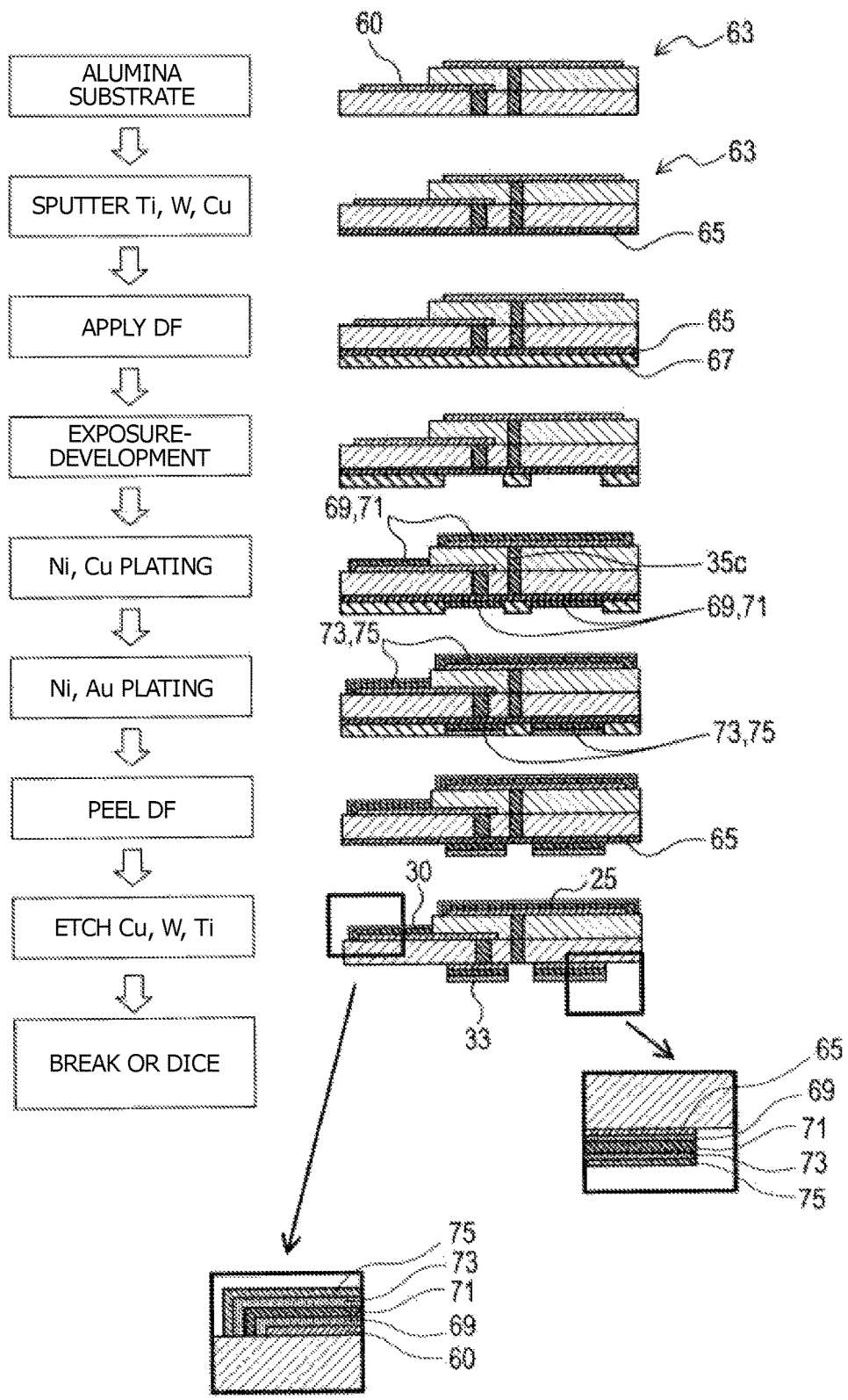
FIG. 7 shows illustrations of a process for forming traces, etc. on the surfaces of the first substrate in the first substrate production process.
Figure 8:
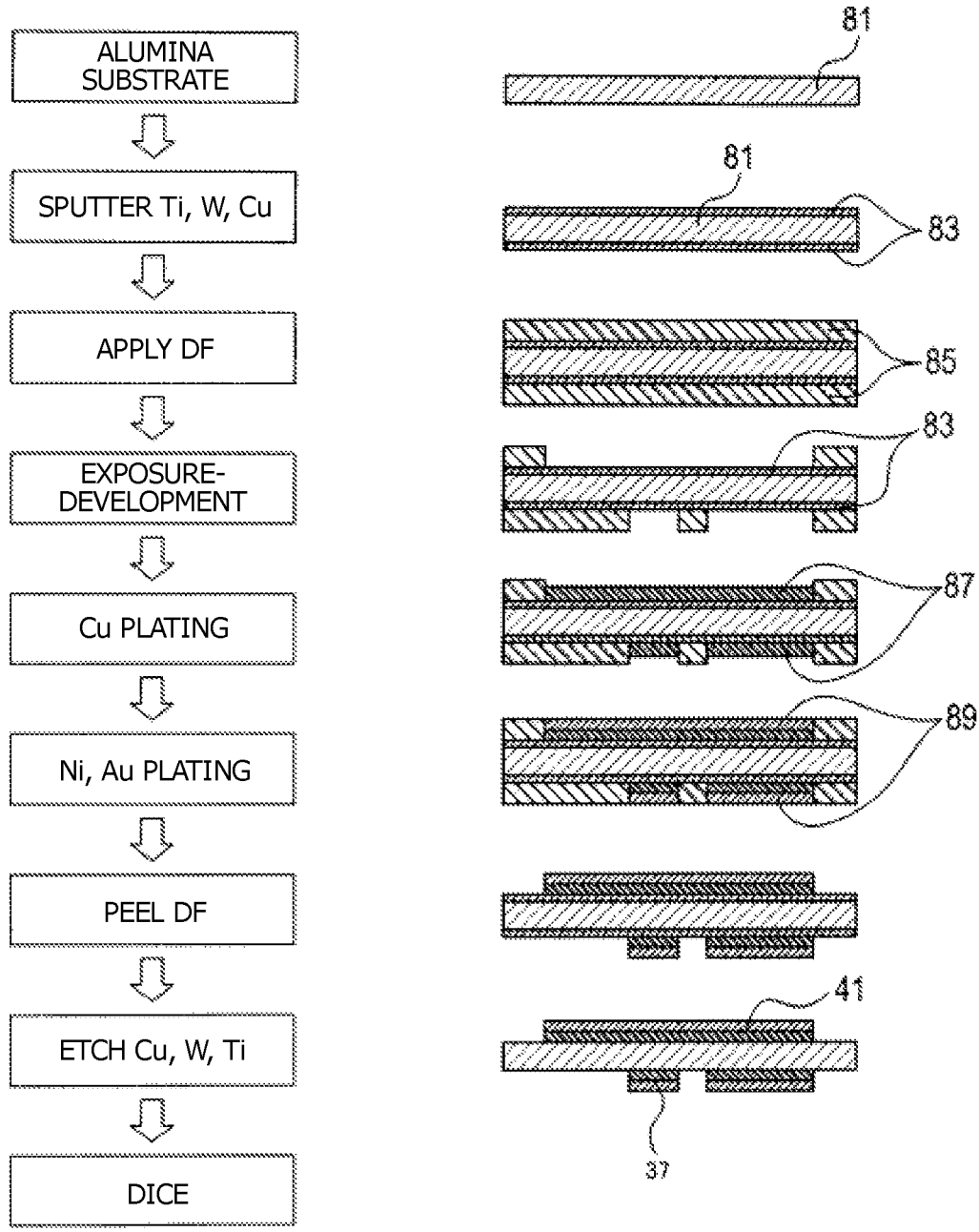
FIG. 8 shows illustrations of part of a second substrate production process.

Next, a method for producing the thermoelectric element-containing package 1 will be described with reference to FIGS. 6 to 8. In FIGS. 6 to 8, cross sections of members etc. included in the first and second substrates 5 and 9 are schematically shown.

<Method for Producing First Substrate>

First, a method for producing the first substrate 5 will be described with reference to FIGS. 6 and 7. In the following example described, a plurality of first substrates 5 are produced from a base material.

As shown in FIG. 6, a ceramic slurry prepared from a material such as alumina is used to produce a first ceramic green sheet (hereinafter referred to simply as a green sheet) 51 that later becomes the inner ceramic layer 5a and a second green sheet 53 that later becomes the outer ceramic layer 5b using, for example, a doctor blade method.

Then through holes 55 for forming the vias 35 are punched in the green sheets.

Next, the through holes 55 in the green sheets 51 and 53 are filled with a via ink 57 containing a conductive material such as tungsten (i.e., the via ink is filled into the holes).

Next, a metallizing paste composed of a conductive material such as tungsten is used to form green traces 59 that later become the integrated conductive traces 30 and the back-side conductor 25 on surfaces (the upper outer surfaces in FIG. 6) of the green sheets 51 and 53.

Next, the green sheets 51 and 53 are compression-bonded to form a stacked body 61.

Next, breaking grooves (not shown) are formed in the stacked body 61 at positions at which the first substrates 5 are to be separated. The breaking grooves are used to facilitate separation of the first substrates 5, and the step of forming the breaking grooves is omitted when the first substrates 5 are separated, for example, by dicing.

Next, the stacked body 61 is fired to produce a base ceramic substrate (i.e., an alumina substrate including the integrated conductive traces 30 and the back-side conductor 25) 63.

Then the lower surface (i.e., the inner surface) of the alumina substrate 63 is polished if necessary.

Next, as shown in FIG. 7, a sputtered layer 65 serving as a seed layer for electrolytic plating and including a Ti sputtered layer, a W sputtered layer, and a Cu sputtered layer is formed on one surface (the inner main surface 15 on the lower side in FIG. 7) of the alumina substrate 63 by sputtering titanium (Ti), W, and Cu. The sputtered layer 65 serving as the seed layer for electrolytic plating may be formed of a TiW sputtered layer and a Cu sputtered layer or of a Ti sputtered layer and a Cu sputtered layer.

Next, a dry film (i.e., DF) 67 formed of a photosensitive resin is applied so as to cover the surface of the sputtered layer 65.

Next, the DF 67 is exposed to light and developed to remove the DF 67 only from specific regions (i.e., regions on which the inner conductive traces 33 are to be formed by plating described later), and the sputtered layer 65 on the alumina substrate 63 is thereby partially exposed.

Next, the exposed portions of the sputtered layer 65, the exposed portions 60 of the integrated conductive traces 30 (i.e., part of portions that later become the outer conductive traces 29) (see FIG. 6), and the back-side conductor 25 are plated with Ni and then with Cu to form a Ni plating layer 69 and a Cu plating layer 71. The back-side conductor 25 is connected to the sputtered layer 65 through a via 35c for plating. Therefore, the Ni plating layer 69 and the Cu plating layer 71 are formed also on the back-side conductor 25.

Next, the surface of the Cu plating layer 71 is plated with Ni and then with gold (Au) to form a Ni plating layer 73 and a Au plating layer 75.

Next, the DF 67 is peeled off to expose the sputtered layer 65.

Next, the exposed portions of the sputtered layer 65 are removed by etching. Since the sputtered layer 65 includes the Ti sputtered layer, the W sputtered layer, and the Cu sputtered layer stacked in this order on the substrate, the Cu sputtered layer, the W sputtered layer, and the Ti sputtered layer are removed in this order.

Next, the first substrates 5 are separated from each other along the breaking grooves, and the first substrates 5 each including the inner conductive traces 33, the integrated conductive traces 30, the back-side conductor 25, etc. are thereby completed. When the first substrates 5 are separated by dicing, the first substrates 5 are diced along dicing lines that define the desired outer shape of the first substrates 5, and the first substrates 5 are thereby separated from each other.

Although not shown in FIG. 7, the metal layer 43 is similarly formed when the inner conductive traces 33 are formed.

<Method for Producing Second Substrate>

Next, a method for producing the second substrate 9 will be described with reference to FIG. 8. In the following example described, a plurality of second substrates 9 are produced from a base material.

As shown in FIG. 8, a ceramic substrate (i.e., an alumina substrate) 81 formed from a material such as alumina is prepared.

A sputtered layer 83 serving as a seed layer for electrolytic plating and including a Ti sputtered layer, a W sputtered layer, and a Cu sputtered layer is formed on both main surfaces of the alumina substrate 81 by sputtering Ti, W, and Cu. Each sputtered layer 83 serving as the seed layer for electrolytic plating may be formed of a TiW sputtered layer and a Cu sputtered layer or of a Ti sputtered layer and a Cu sputtered layer.

Next, dry films (i.e., DFs) 85 formed of a photosensitive resin are applied so as to cover the surfaces of the sputtered layers 83.

Next, the DFs 85 are exposed to light and developed to remove the DFs 85 only from specific regions (i.e., regions on which the inner conductive traces 37 are to be formed by plating described later), the sputtered layers 83 on the alumina substrate 81 are thereby partially exposed.

The exposed portions of the sputtered layers 83 are plated with Cu to form Cu plating layers 87.

Next, the surfaces of the Cu plating layers 87 are plated with Ni and then with Au to form Ni-Au plating layers 89.

Next, the DFs 85 are peeled off to expose the sputtered layers 83.

Next, the sputtered layers 83 in the exposed portions are removed by etching.

Next the second substrates 9 are separated by dicing, and the second substrates 9 each including the inner conductive traces 37, the front-side conductor 41, etc. are thereby completed. Breaking grooves may be formed in advance, and the second substrates 9 may be separated along the breaks in a manner similar to that in the method for producing the first substrate 5.

Although not shown in FIG. 8, the metal layer 45 is similarly formed when the inner conductive traces 37 are formed.

<Method for Forming Overall Structure>

Figure 9:
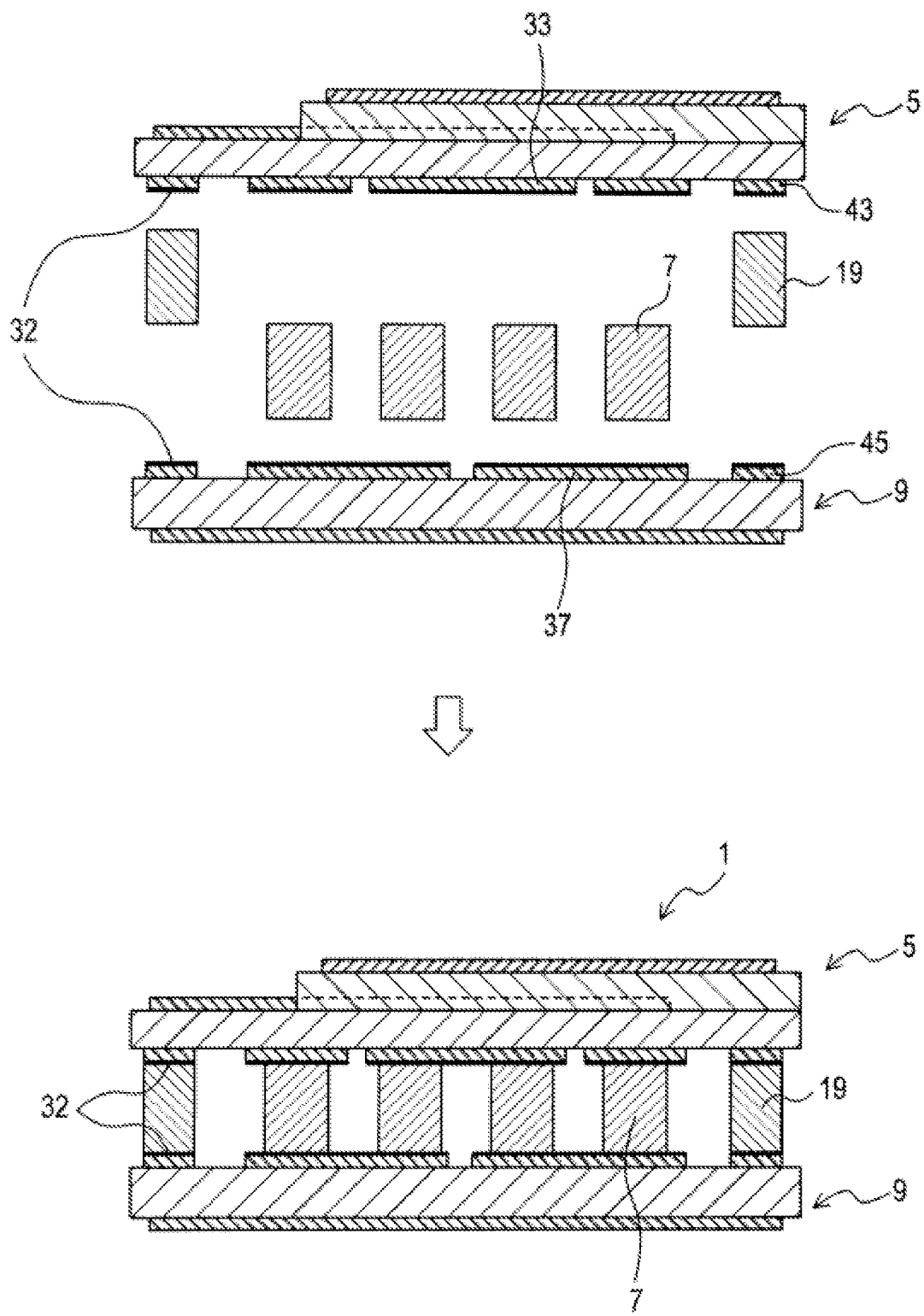
FIG. 9 is an illustration showing the step of joining the first substrate, the second substrate, the thermoelectric elements, and the frame together to assemble the thermoelectric element-containing package.

Next, as shown in the upper part of FIG. 9, the bonding material 32 is applied to the surfaces of the inner conductive traces 33 on the first substrate 5 and the surface of the metal layer 43. For example, a paste of a solder material such as SnSb or AuSn is applied.

Moreover, the same bonding material 32 is applied to the surfaces of the inner conductive traces 37 on the second substrate 9 and the surface of the metal layer 45.

Next, the plurality of thermoelectric elements 7 are disposed in prescribed positions (see FIG. 4D) between the first substrate 5 and the second substrate 9, and the frame 19 is disposed so as to surround all the thermoelectric elements 7.

In another method for forming the bonding material 32, small pieces punched from a sheet-shaped solder material preform may be used. In this case, first, the small pieces of the solder material are placed on the surfaces of the inner conductive traces 37 on the second substrate 9 and the surface of the metal layer 45. Next, the plurality of thermoelectric elements 7 are disposed, and the frame 19 is disposed so as to surround all the thermoelectric elements 7. Next, small pieces of the solder material are placed on end surfaces of the plurality of thermoelectric elements that face the surface of the first substrate and on an end surface of the frame 19 that faces the surface of the first substrate to thereby form the bonding material 32.

The frame 19 is a ceramic-made frame prepared by stacking rectangular frame-shaped green sheets composed mainly of alumina and firing the stacked green sheets, as is the first substrate 5. Metallized layers formed of, for example, tungsten are formed on the main surfaces of the frame 19, and the surfaces of the metallized layers are plated with, for example, Ni.

Next, as shown in the lower part of FIG. 9, the thermoelectric elements 7 and the frame 19 are sandwiched between the first substrate 5 and the second substrate 9 through the bonding material 32, and the assembly is heated to bonding temperature (e.g., 240 to 280° C.) and then cooled (i.e., subjected to reflowing).

The thermoelectric elements 7 and the frame 19 are thereby joined to the first substrate 5 and the second substrate 9, and the thermoelectric element-containing package 1 is completed. The description of the via 35*a* connected to one of the outer conductive traces 29, the via 35*c* for plating, etc. is omitted.

[1-5. Effects]

(1) In the first embodiment, the plurality of thermoelectric elements 7 are disposed within the hermetically sealed space 13*a* that is externally surrounded by the frame 19 and disposed between the first substrate 5 and the second substrate 9. In this case, the following effect is obtained. When electric power is supplied to the thermoelectric elements 7, the temperature of the first substrate 5 or the second substrate 9 becomes lower than the ambient temperature. Even in this case, dew condensation is unlikely to occur in the hermetically sealed space 13*a*.

This is advantageous in that a short circuit is unlikely to occur in, for example, the inner conductive traces 33 and 37 and that corrosion is unlikely to occur in, for example, the inner conductive traces 33 and 37. Another advantage is that, since water absorption by the thermoelectric elements 7 is prevented, the properties of the thermoelectric elements 7 are unlikely to deteriorate.

(2) In the first embodiment, inner conductive traces 33 connected to thermoelectric elements 7 are connected to the outer conductive traces 29 through the vias 35.

Since the external wiring lines 3 for supplying electricity can be connected to the outer conductive traces 29 using, for example, solder, the external wiring lines 3 can be easily connected. Therefore, the cost of production can be reduced.

Since the outer conductive traces 29 are formed on the side opposite to the thermoelectric elements 7, the outer conductive traces 29 and the external wiring lines 3 do not interfere with the thermoelectric elements 7 and the inner conductive traces 33. This is advantageous in that less constraints are imposed on the arrangement of the outer conductive traces 29 and the external wiring lines 3.

Unlike conventional cases, it is unnecessary to increase the area of the substrates (i.e., their footprint) in order to provide sufficient regions for disposing external connection terminals for connecting the external wiring lines. This is advantageous in that the first substrate 5 and the second substrate 9 facing the first substrate 5 can be reduced in size.

(3) In the first embodiment, inner conductive traces 33 connected to thermoelectric elements 7 are connected through the vias 35 to the embedded conductive traces 31 embedded in the first substrate 5, and the embedded conductive traces 31 are connected to the respective the outer conductive traces 29.

Specifically, it is only necessary that the vias 35 be disposed so as to be connected to the embedded conductive traces 31. This is advantageous in that the degree of flexibility of the arrangement of the vias 35 increases. Moreover, the outer conductive traces 29 can be disposed irrespective of the arrangement of the vias 35, so long as the outer conductive traces 29 are connected to the respective embedded conductive traces 31. This is advantageous in that the degree of flexibility of the arrangement of the outer conductive traces 29 increases.

(4) In the first embodiment, the outer conductive traces 29 are formed in the lowered portions 27. Therefore, even after the external wiring lines 3 are connected to the outer conductive traces 29, the external wiring lines 3 are unlikely to protrude outward from the outer main surface 21 of the first substrate 5. This is advantageous in that, even after the semiconductor element 23 etc. are disposed on the back-side conductor 25, the external wiring lines 3 are unlikely to interfere with the semiconductor element 23, lead wires extending from the semiconductor element 23, etc.

(5) In the first embodiment, the first substrate 5, the second substrate 9, and the frame 19 are formed of the same material and have the same thermal expansion coefficient. Therefore, even when temperature changes, thermal stress is unlikely to act on the joint portions of the first substrate 5, the second substrate 9, and the frame 19. This is advantageous in that deformation and breakage due to the thermal stress can be prevented.

[1-6. Correspondence between Terms]

The first substrate 5, the thermoelectric elements 7, the second substrate 9, the thermoelectric conversion module 11, the thermoelectric element-containing package 1, the hermetically sealed space 13a, the frame 19, the semiconductor element 23, and the back-side conductor 25 in the first embodiment correspond to examples of the first substrate, the thermoelectric elements, the second substrate, the thermoelectric conversion module, the thermoelectric element-containing package, the hermetically sealed space, the frame, the device, and the placement member of the present disclosure.

2. Second Embodiment

Next, a second embodiment will be described, but description of the same details as those in the first embodiment will be omitted or simplified. The same components as those in the first embodiment will be denoted by the same numerals.

Figure 10:
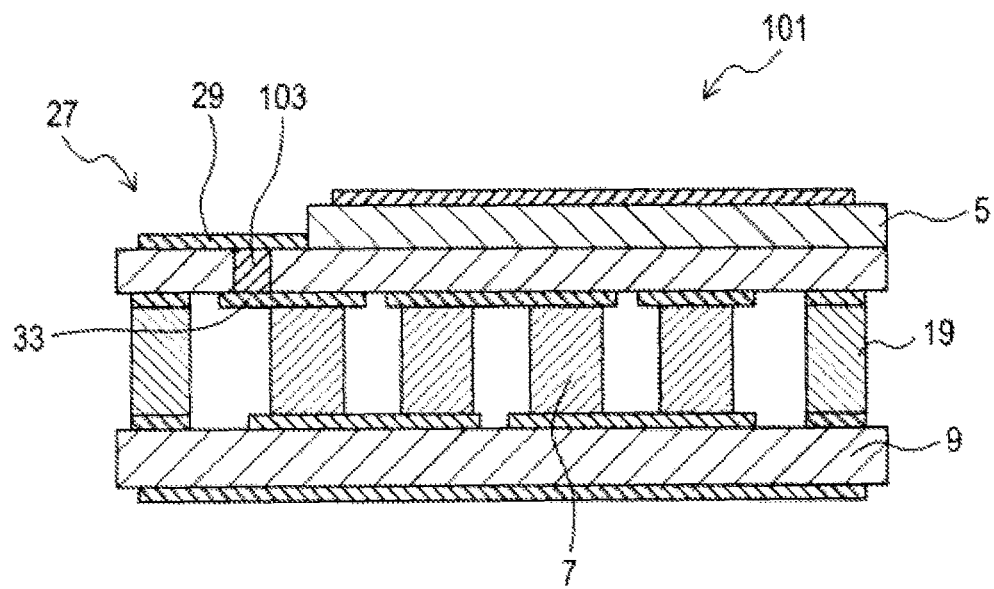
FIG. 10 is a cross-sectional view schematically showing a thermoelectric element-containing package of a second embodiment cut in its thickness direction along the XY plane.

As shown in FIG. 10, in a thermoelectric element-containing package 101 in the second embodiment, as in the first embodiment, the plurality of thermoelectric elements 7 and the frame 19 surrounding all the thermoelectric elements 7 are disposed between the first substrate 5 and the second substrate 9.

In the second embodiment, the outer conductive traces 29 formed in the lowered portions 27 are connected to inner conductive traces 33 on the first substrate 5 through vias 103 within the lowered portions 27.

The effects of the second embodiment are the same as those of the first embodiment.

3. Third Embodiment

Next, a third embodiment will be described, but description of the same details as those in the first embodiment will be omitted or simplified. The same components as those in the first embodiment will be denoted by the same numerals.

Figure 11:
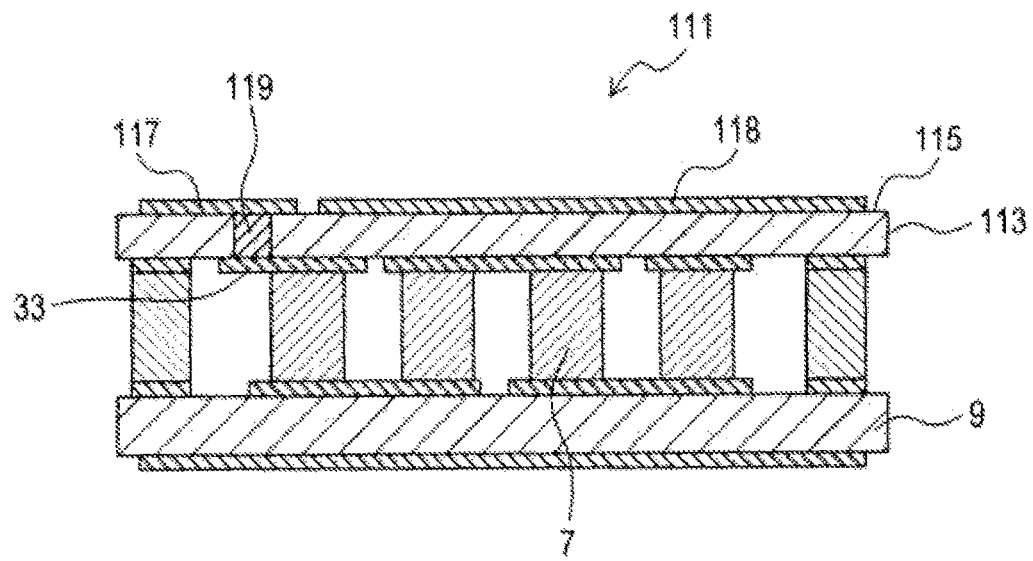
FIG. 11 is a cross-sectional view schematically showing a thermoelectric element-containing package of a third embodiment cut in its thickness direction along the XY plane.

As shown in FIG. 11, in a thermoelectric element-containing package 111 in the third embodiment, a first substrate 113 differs from that in the first embodiment and is composed of a single flat plate-shaped ceramic layer with no lowered portions.

Outer conductive traces 117 and a back-side conductor 118 are formed on the outer main surface 115 of the first substrate 113. Another back-side conductor (not shown) is formed on the outer main surface 115 at a different position in plan view.

In the third embodiment, as in the first embodiment, the plurality of thermoelectric elements 7 and the frame 19 are disposed between the first substrate 113 and the second substrate 9. The outer conductive traces 117 are connected to inner conductive traces 33 on the first substrate 113 through vias 119.

The effects of the third embodiment are the same as those of the first embodiment. The third embodiment is advantageous in that the structure of the first substrate 113 can be simplified.

4. Fourth Embodiment

Next, a fourth embodiment will be described, but description of the same details as those in the first embodiment will be omitted or simplified. The same components as those in the first embodiment will be denoted by the same numerals.

Figure 12:
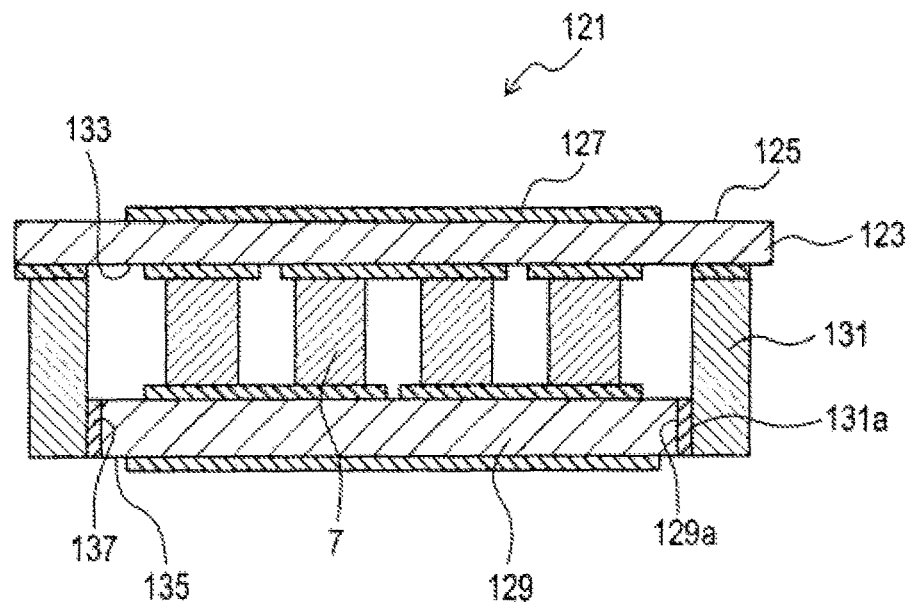
FIG. 12 is a cross-sectional view schematically showing a thermoelectric element-containing package of a fourth embodiment cut in its thickness direction along the XY plane.

As shown in FIG. 12, a thermoelectric element-containing package 121 in the fourth embodiment includes a flat plate-shaped first substrate 123 similar to that in the third embodiment. Outer conductive traces 127 similar to those in the third embodiment are formed on the outer main surface 125 of the first substrate 123.

In the fourth embodiment, the planar shape of a second substrate 129 is smaller than that of the first substrate 123 and has the same size as an opening portion of a frame 131.

Specifically, the frame 131 extends from the inner main surface 133 of the first substrate 123 to a position reaching the outer main surface 135 of the second substrate 129, and side surfaces 129a of the second substrate 129 are surrounded by the frame 131.

An unillustrated metallized layer is formed on the side surfaces 129a of the second substrate 129 and on at least part of an inner circumferential surface 131a of the frame 131, and the side surfaces 129a of the second substrate 129 are joined to the inner circumferential surface 131a of the frame 131 through a bonding material (e.g., a solder material) 137.

The plurality of thermoelectric elements 7 are disposed between the first substrate 123 and the second substrate 129. Vias etc. are omitted.

The effects of the fourth embodiment are the same as those of the first embodiment. The spacing between the first substrate 123 and the second substrate 129 is not limited by the height of the frame 131 (i.e., its vertical dimension in FIG. 12). This is advantageous in that a gap is unlikely to be formed between the first substrate 123 and the thermoelectric elements 7 and between the second substrate 129 and the thermoelectric elements 7, so that they can be joined together reliably.

5. Fifth Embodiment

Next, a fifth embodiment will be described, but description of the same details as those in the first embodiment will be omitted or simplified. The same components as those in the first embodiment will be denoted by the same numerals.

Figure 13:
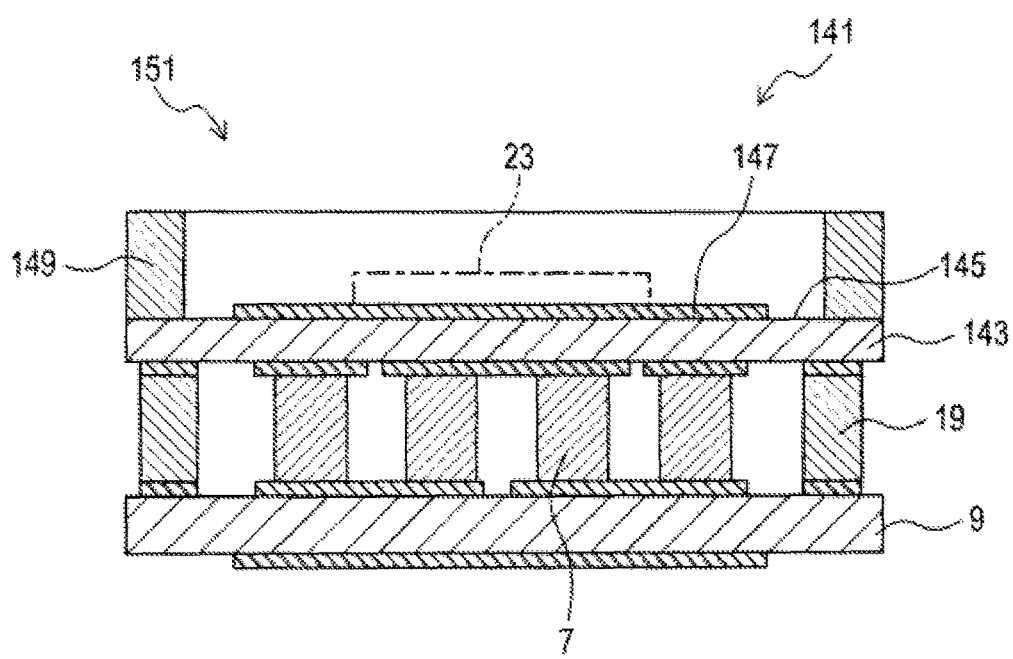
FIG. 13 is a cross-sectional view schematically showing a thermoelectric element-containing package of a fifth embodiment cut in its thickness direction along the XY plane.

As shown in FIG. 13, a thermoelectric element-containing package 141 in the fifth embodiment includes a flat plate-shaped first substrate 143 similar to that in the third embodiment. Outer conductive traces 147 similar to those in the third embodiment are formed on the outer main surface 145 of the first substrate 143.

The plurality of thermoelectric elements 7 and the frame 19 are disposed between the first substrate 143 and the second substrate 9.

In the fifth embodiment, a rectangular frame-shaped side wall 149 in plan view is formed along the outer circumference of the outer main surface 145 of the first substrate 143. The side wall 149 is made of a ceramic (e.g., made of alumina) similar to that of the first substrate 143.

Specifically, the first substrate 143 and the side wall 149 form a housing 151 having an upper opening (i.e., an opening on the upper side in FIG. 13) and capable of housing a device such as the semiconductor element 23.

The first substrate 143 and the side wall 149 can be formed by firing green sheets having prescribed shapes simultaneously.

The effects of the fifth embodiment are the same as those of the first embodiment. Moreover, advantageously, a device such as the semiconductor element 23 can be housed in the housing 151. Although not illustrated, lowered portions corresponding to the lowered portions 27 may be formed in the second substrate 9, and outer conductive traces corresponding to the outer conductive traces 29 may be formed on the second substrate 9.

6. Sixth Embodiment

Next, a sixth embodiment will be described, but description of the same details as those in the first embodiment will be omitted or simplified. The same components as those in the first embodiment will be denoted by the same numerals.

Figure 14:
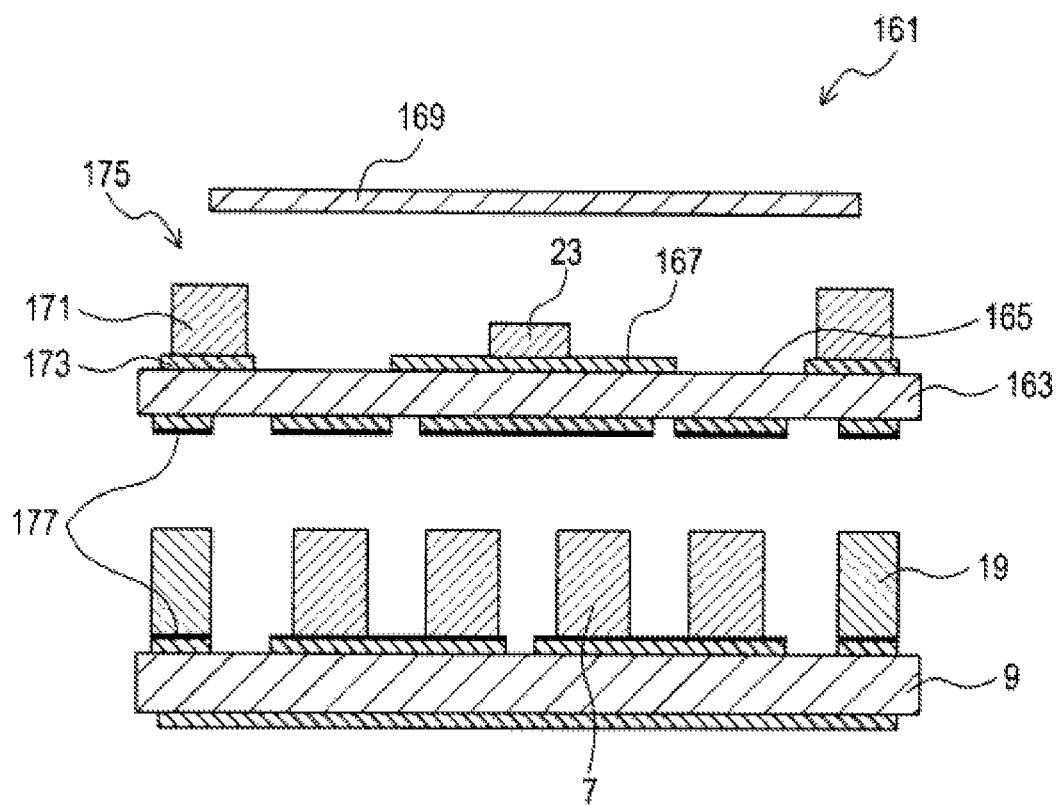
FIG. 14 is a cross-sectional view schematically showing an exploded thermoelectric element-containing package of a sixth embodiment cut in its thickness direction along the XY plane.

As shown in FIG. 14, a thermoelectric element-containing package 161 in the sixth embodiment includes a flat plate-shaped first substrate 163 similar to that in the third embodiment. Outer conductive traces 167 similar to those in the third embodiment are formed on the outer main surface 165 of the first substrate 163.

In the sixth embodiment, a device such as the semiconductor element 23 is connected (i.e., joined) to the outer conductive traces 167. Moreover, a metal-made lid 169 and a ceramic- or metal-made side wall 171 having a rectangular frame shape in plan view are disposed so as to cover the outer conductive traces 167, the semiconductor element 23, etc.

Specifically, a metallized layer 173 is formed along the outer circumference of the outer main surface 165 of the first substrate 163, and the side wall 171 is joined to the metallized layer 173 by, for example, brazing. The lid 169 is joined to the upper surface (i.e., the surface on the upper side in FIG. 14) of the side wall 171 by, for example, resistance welding.

The metal used for the lid 169 and the side wall 171 may be KOVAR™ alloy. The surface of the KOVAR™ alloy may be covered with metal plating such as Ni plating, Au plating, or Ni-Au plating. The ceramic used for the side wall 171 is alumina, aluminum nitride, glass ceramic, silicon nitride, etc. The ceramic used for the side wall 171 is more preferably the ceramic used for the first substrate 163 and the second substrate 9 in order to prevent a failure such as deformation and breakage of the first substrate 163 and the side wall 171 caused by the difference in thermal expansion generated during joining and a joint failure such as deformation and breakage of the joint portion between the first substrate 163 and the side wall 171.

The plurality of thermoelectric elements 7 and the frame 19 are disposed between the first substrate 163 and the second substrate 9.

FIG. 14 shows the production of the thermoelectric element-containing package 161 in the sixth embodiment.

In the sixth embodiment, the first substrate 163 used is the first substrate in the first embodiment that has been subjected to the step of forming the Ni plating layer 73. First, the first substrate 163 and the side wall 171 are jointed together using a bonding material (e.g., a brazing material composed of Ag and Cu) (heated to, for example, 700 to 900° C.) to produce a housing 175.

Next, Ni plating and Au plating are sequentially formed on conductive portions of the housing 175 by electroless plating or electrolytic plating. Next, the plurality of thermoelectric elements 7 and the frame 19 are disposed between the first substrate 163 in the housing 175 and the second substrate 9, and they are joined together with a bonding material 177 in the same manner as in the first embodiment. Finally, the semiconductor element 23 etc. are placed inside the housing 175, and the lid 169 is joined by resistance welding to hermetically seal the housing 175.

The effects of the sixth embodiment are the same as those of the first embodiment. The sixth embodiment is advantageous in that the semiconductor element 23 etc. can be housed inside the hermetically sealed housing 175.

7. Seventh Embodiment

Next, a seventh embodiment will be described, but description of the same details as those in the first embodiment will be omitted or simplified. The same components as those in the first embodiment will be denoted by the same numerals.

Figure 15:
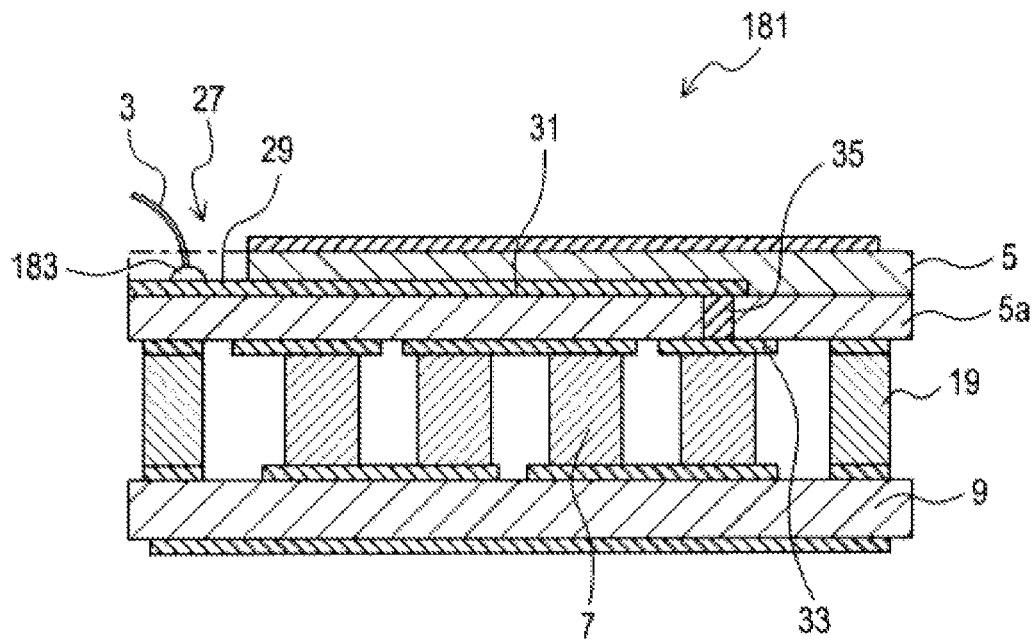
FIG. 15 is a cross-sectional view schematically showing a thermoelectric element-containing package of a seventh embodiment cut in its thickness direction along the XY plane.

As shown in FIG. 15, in a thermoelectric element-containing package 181 in the seventh embodiment, as in the first embodiment, the plurality of thermoelectric elements 7 and the frame 19 that surrounds all the thermoelectric elements 7 are disposed between the first substrate 5 and the second substrate 9.

In the seventh embodiment, the outer conductive traces 29 formed on the surfaces of the lowered portions 27 are connected to the embedded conductive traces 31 disposed in the first substrate 5. The embedded conductive traces 31 are connected to inner conductive traces 33 on the first substrate 5 through the vias 35 passing through the inner ceramic layer 5a of the first substrate 5.

Figure 16A:
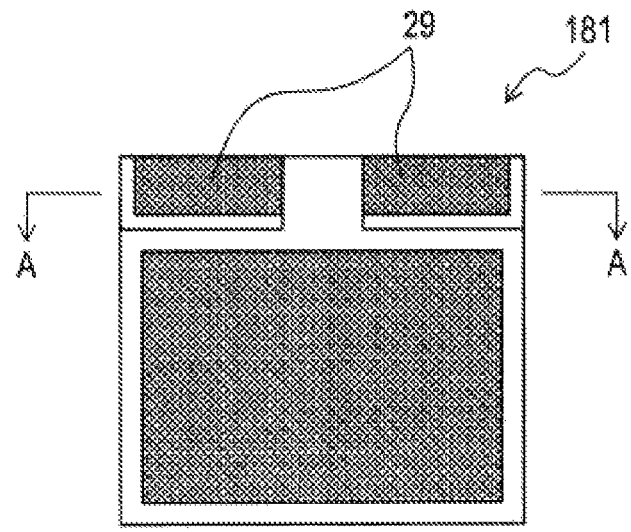
FIG. 16A is a plan view showing the thermoelectric element-containing package of the seventh embodiment.
Figure 16B:
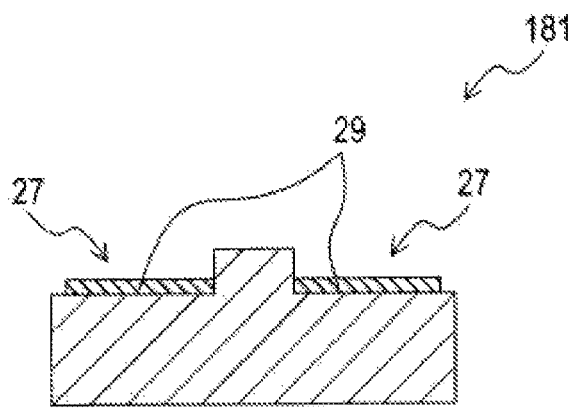
FIG. 16B is a cross-sectional view schematically showing an A-A cross section in FIG. 16A.

As shown in FIGS. 16A and 16B, the lowered portions 27 are disposed in the left and right directions, and the outer conductive traces 29 are formed on the surfaces of the respective lowered portions 27.

The external wiring lines 3 are connected to the outer conductive traces 29 through connection portions 183 (see FIG. 15) made of, for example, solder.

The effect of the seventh embodiment are the same as those of the first embodiment.

8. Eighth Embodiment

Next, an eighth embodiment will be described, but description of the same details as those in the seventh embodiment will be omitted or simplified. The same components as those in the seventh embodiment will be denoted by the same numerals.

Figure 17:
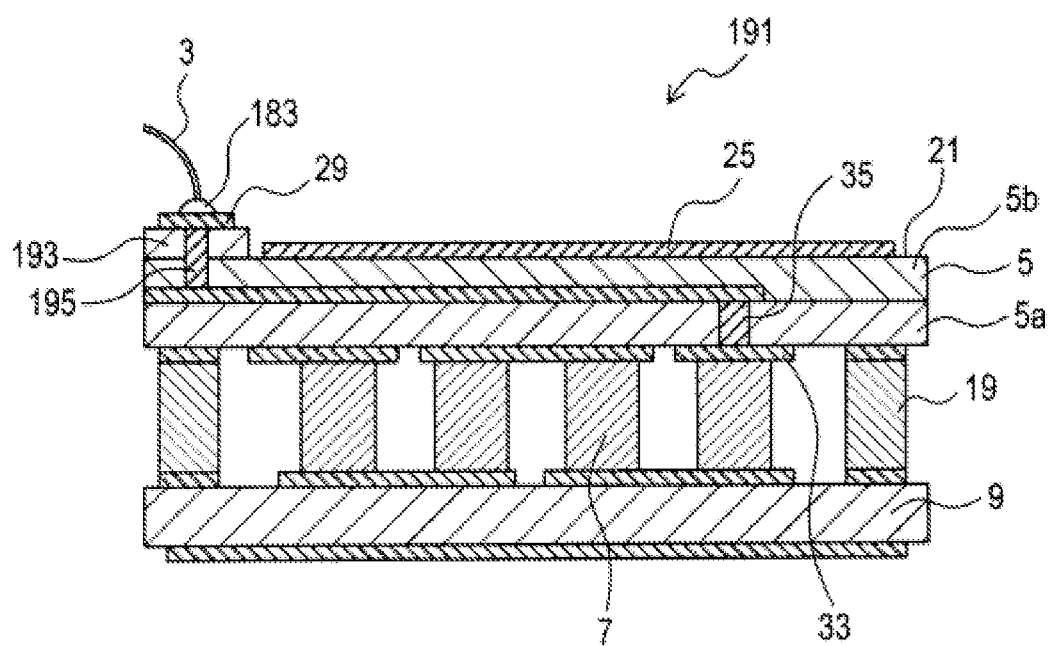
FIG. 17 is a cross-sectional view schematically showing a thermoelectric element-containing package of an eighth embodiment cut in its thickness direction along the XY plane.

As shown in FIG. 17, in a thermoelectric element-containing package 191 in the eighth embodiment, as in the seventh embodiment, the plurality of thermoelectric elements 7 and the frame 19 that surrounds all the thermoelectric elements 7 are disposed between the first substrate 5 and the second substrate 9. In the eighth embodiment, the lowered portions 27 in the seventh embodiment are not provided, and the first substrate 5 is a substrate with a uniform thickness.

In the eighth embodiment, the embedded conductive traces 31 are disposed between the inner ceramic layer 5a and the outer ceramic layer 5b of the first substrate 5. The embedded conductive traces 31 are connected to inner conductive traces 33 on the first substrate 5 through the vias 35 passing through the inner ceramic layer 5a of the first substrate 5. The embedded conductive traces 31 extend to positions at the left edge in FIG. 17.

Figure 18A:
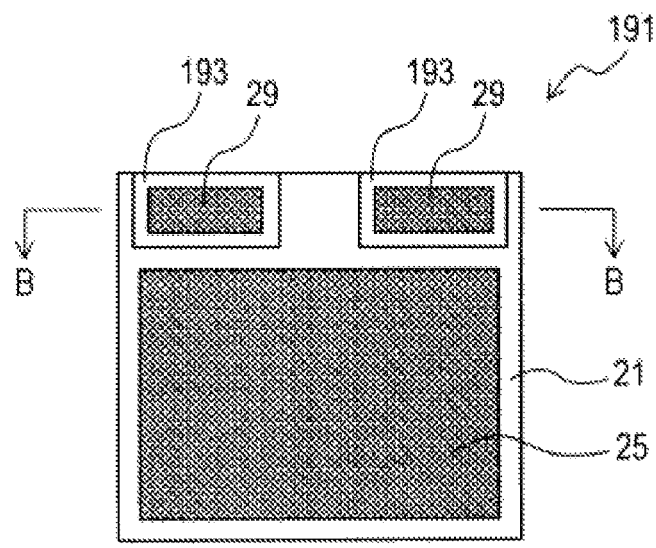
FIG. 18A is a plan view of the thermoelectric element-containing package of the eighth embodiment.
Figure 18B:
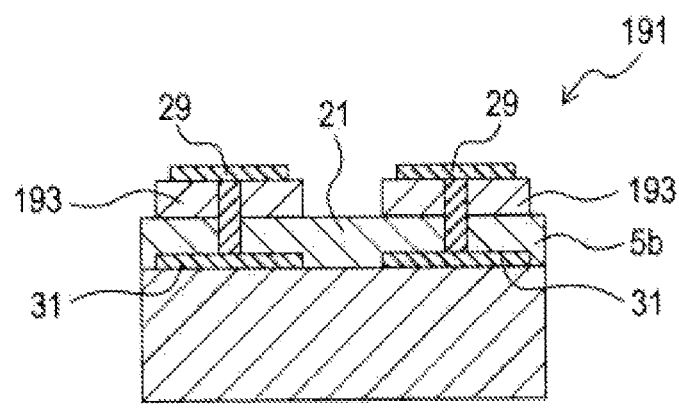
FIG. 18B is a cross-sectional view schematically showing a B-B cross section in FIG. 18A.

In particular, in the eighth embodiment, as shown in FIGS. 17, 18A, and 18B, a ceramic edge layer 193 serving as protruding portions is stacked on the outer main surface 21 of the first substrate 5 at one edge portion of the main surface 21 (on the left side in FIG. 17). Moreover, the back-side conductor 25 serving as the placement member is disposed on the main surface 21 so as to be spaced apart from the ceramic edge layer 193.

The ceramic edge layer 193 protrudes outward (upward in FIG. 17) from the outer ceramic layer 5b and is higher than the surface of the back-side conductor 25. Specifically, the height of the ceramic edge layer 193 from the main surface 21 of the first substrate is larger than the height of the back-side conductor 25 from the main surface 21. The outer conductive traces 29 are formed on the outer surface of the ceramic edge layer 193.

As shown in FIG. 17, the outer conductive traces 29 are connected to the embedded conductive traces 31 through vias 195 that pass through the ceramic edge layer 193 and the outer ceramic layer 5b in the thickness direction.

The external wiring lines 3 are connected to the outer conductive traces 29 through the connection portions 183 formed of, for example, solder.

The effects of the eighth embodiment are the same as those of the second embodiment.

In the eighth embodiment, the outer conductive traces 29 are disposed on the ceramic edge layer 193 serving as the protruding portions. In this case, even when the external wiring lines 3 are connected to the outer conductive traces 29, the connection portions 183 between the outer conductive traces 29 and the external wiring lines 3 are located higher than the back-side conductor 25 formed on the outer main surface 21 of the first substrate 5. Therefore, in this case, the distance between the back-side conductor 25 and the external wiring lines 3 etc. can be sufficiently larger than that when the height of the back-side conductor 25 is the same as the height of the outer conductive traces 29.

Therefore, advantageously, even when a device such as the semiconductor element 23 is disposed on the back-side conductor 25, the external wiring lines 3 are unlikely to interfere with the device and conductive lines (not shown) connected to the device.

The outer conductive traces 29 are disposed on the ceramic edge layer 193, and the height of the back-side conductor 25 differs from the height of the outer conductive traces 29 due to the presence of the ceramic edge layer 193. This is advantageous in that, in the case where the external wiring lines 3 is connected to the outer conductive traces 29 through use of a conductive bonding material such as solder, it is possible to prevent the conductive bonding material from coming into contact with the back-side conductor 25, which would otherwise occur due to flow of the conductive bonding material. Another advantage is that formation of a short circuit between the external wiring lines 3 and the device, etc. disposed on the back-side conductor 25 due to adhesion of foreign matter can be prevented.

9. Other Embodiments

The present disclosure is not limited to the embodiments described above etc., and it will be appreciated that the present disclosure can be implemented in various forms so long as they fall within the technical scope of the disclosure.

(1) The inner and outer ceramic layers of the first substrate, the second substrate, the frame, and the side wall may each be composed of a plurality of ceramic layers. For example, a stack of a plurality of green sheets may be fired to form an integrated ceramic layer.

The same material may be used for the first substrate, the second substrate, the frame, and the side wall. Some or all of the materials of the four members may differ from each other.

(2) The frame used may have a thermal conductivity equal to or less than the thermal conductivity of the first substrate and the thermal conductivity of the second substrate. For example, when the first substrate and the second substrate are each an alumina substrate, the frame used may be, for example, a glass ceramic-made or zirconia-made frame having a smaller thermal conductivity than the alumina substrate.

(3) KOVAR™ alloy can be used as the material of the frame. The surface of KOVAR™ alloy may be covered with metal plating such as Ni plating, Au plating, or Ni-Au plating according to the type of bonding material 32.

(4) The first and second substrates are not limited to the aluminum-made substrates, and substrates made of aluminum nitride, glass ceramic, silicon nitride, etc. may be used.

Figure 19:
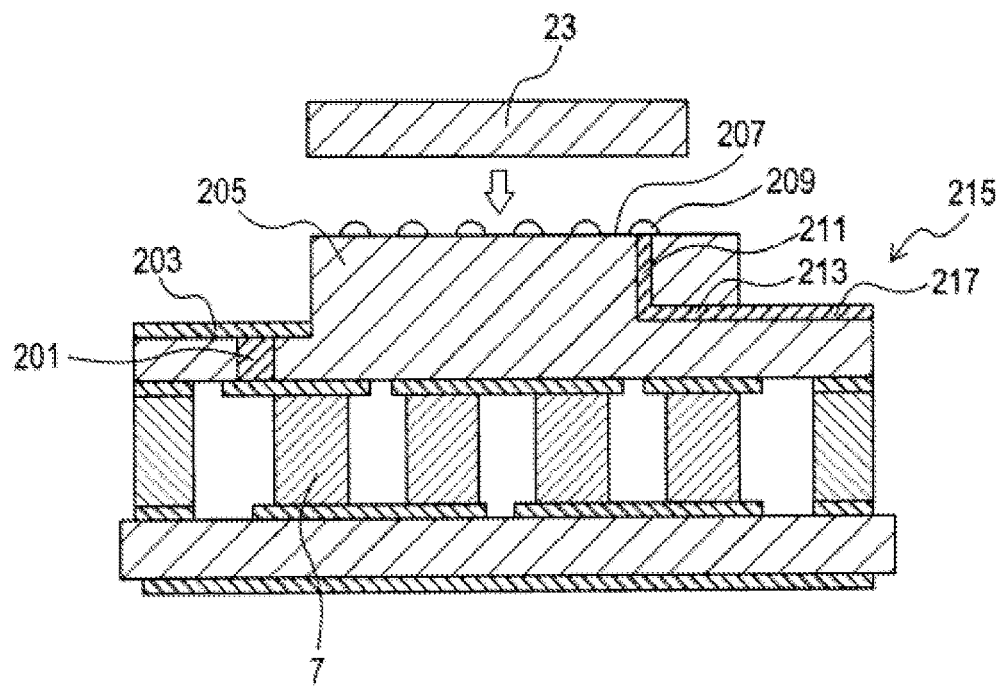
FIG. 19 is a cross-sectional view schematically showing a thermoelectric element-containing package of another embodiment cut and broken in its thickness direction along the XY plane.

(5) A device such as a semiconductor element is disposed on the first substrate or the second substrate. In this case, as shown in, for example, FIG. 19, conductive portions electrically connected to the semiconductor element 23 may be provided in addition to conductive portions (e.g., outer conductive traces 203) connected to thermoelectric elements 7 through vias 201 etc.

For example, solder bumps 209 connected to the semiconductor element 23 are provided on the outer main surface 207 of a first substrate 205, and vias 211 and internal wiring lines 213 are provided inside the first substrate 205. Lowered portions 215 recessed toward the thermoelectric elements 7 are provided on part of the outer main surface 207 of the first substrate 205, and external wiring lines 217 are formed on the surfaces of the lowered portions 215. Specifically, the solder bumps 209, the vias 211, the internal wiring lines 213, and the external wiring lines 217 may form conductive portions.

(6) When a device such as a semiconductor element is placed on a placement member (for example, the back-side conductor) on the first substrate or the second substrate and is hermetically sealed, the outer conductive traces may be disposed outside the hermetically sealed portion.

Specifically, a side wall may be formed on the outer side (i.e., the first main surface side or the fourth main surface side) of the first substrate or the second substrate at a position between the placement member and the outer conductive traces so as to separate the placement member and the outer conductive traces from each other, and the upper surface of the side wall may be covered with, for example, a lid so that the device mounted on the placement member is hermetically sealed.

In this structure, while the device is hermetically sealed, the placement member can be physically isolated from the outer conductive traces. Therefore, even when the external wiring lines are connected to the outer conductive traces and the device is disposed on the placement member, the external wiring lines are prevented from interfering with the device and lead wires connected to the device.

Figure 20:
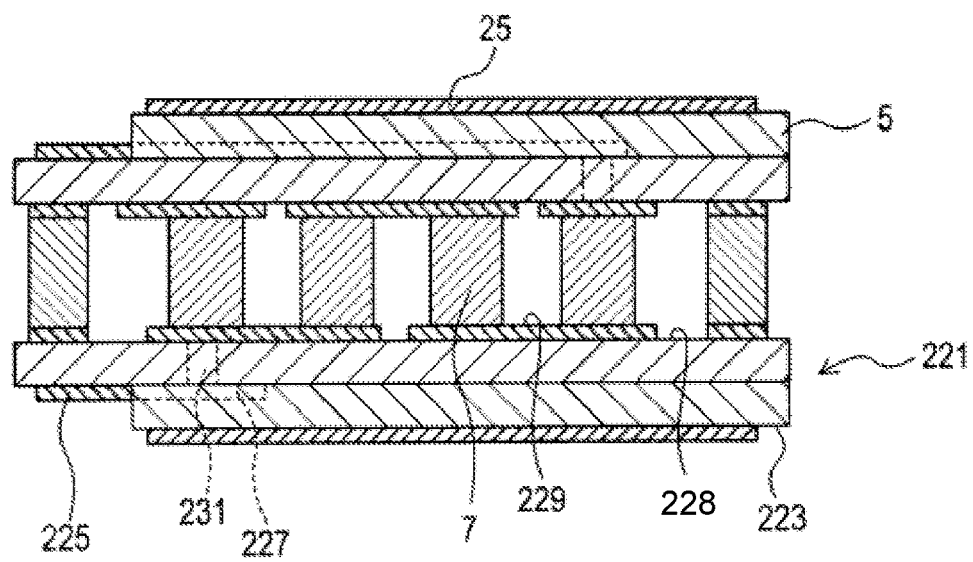
FIG. 20 is a cross-sectional view schematically showing a thermoelectric element-containing package of still another embodiment cut and broken in its thickness direction along the XY plane.
Figure 21:
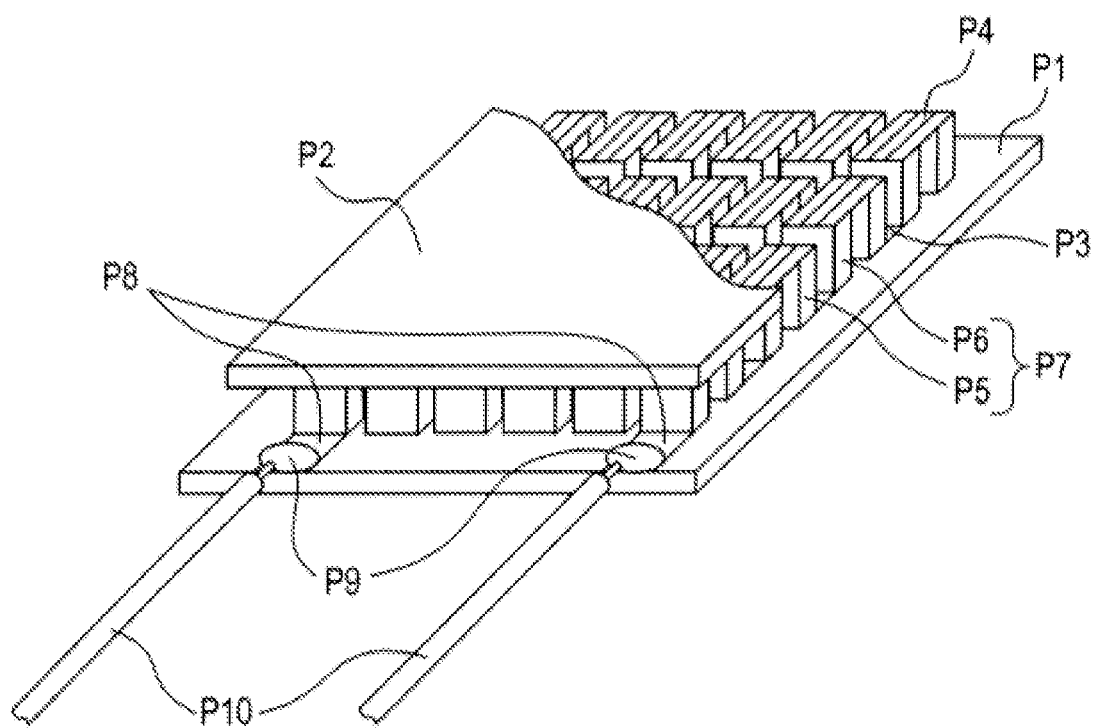
FIG. 21 is an illustration of a conventional technique.

(7) In the first embodiment etc., the outer conductive traces, the embedded conductive traces, the inner conductive traces, the first via conductors, etc. are disposed in the first substrate. However, as shown in FIG. 20, outer conductive traces 225 may be disposed on the outer main surface (fourth main surface) 223 of a second substrate 221, and embedded conductive traces 227 connected to the outer conductive traces 225 may be embedded in the second substrate 221. Inner conductive traces 229 may be disposed on the inner main surface (third main surface) 228 of the second substrate 221, and vias (third via conductors) 231 that electrically connect the embedded conductive traces 227 to the inner conductive traces 229 may be provided in the second substrate 221.

In this case, one of the external wiring lines 3 is connected to one of outer conductive traces 225 on the first substrate 5, and the other external wiring line 3 is connected to one of the outer conductive traces 225 on the second substrate 221. When a current is supplied to the external wiring lines 3, the Peltier effect can be obtained.

The plurality of thermoelectric elements 7 disposed between the first substrate 5 and the second substrate 221 are arranged and electrically connected (e.g., arranged as in the first embodiment) such that, when a current is supplied to the external wiring lines 3, the plurality of thermoelectric elements 7 exhibit the Peltier effect as well known.

The structure of the second substrate may be the same as the structure of the first substrate in any of the embodiments described above. Specifically, the second substrate may or may not have the lowered portions and the protruding portions.

(8) The function of one constituent element in the above embodiments may be distributed to a plurality of constituent elements, or functions of a plurality of constituent elements may be integrated into one component. Part of the structures of the above embodiments may be omitted. Also, at least part of the structure of each of the above embodiments may be added to or replace the structures of other embodiments. All modes included in the technical idea specified by the wording of the claims are embodiments of the present disclosure.

What is claimed is:

1. A thermoelectric element-containing package comprising
 a thermoelectric conversion module including:
  a first substrate that has a first main surface and a second main surface opposite to the first main surface and is formed of an insulating material;
  a second substrate that has a third main surface and a fourth main surface opposite to the third main surface and is formed of an insulating material, the second substrate being disposed such that the third main surface faces the second main surface; and
  a plurality of thermoelectric elements that are sandwiched between the first substrate and the second substrate and arranged along the second main surface and the third main surface,
 wherein the thermoelectric element-containing package further comprises:
  a frame that is joined to the first substrate and the second substrate so as to form a hermetically sealed space surrounding the plurality of thermoelectric elements between the first substrate and the second substrate; and
  a placement member that is disposed on the first main surface of the first substrate and to which an additional device is to be electrically connected and the additional device is an electric part or an electric apparatus;
 wherein the first substrate includes:
  an inner conductive trace that is disposed on the second main surface and connected to the thermoelectric elements,
  an outer conductive trace that is disposed on the first main surface and exposed to the outside,
  an embedded conductive trace that is connected to the outer conductive trace, and
  a first via conductor that penetrates the first substrate so as to extend between the inner conductive trace and the embedded conductive trace, the first via conductor electrically connecting the inner conductive trace to the embedded conductive trace;
 wherein the first substrate is comprised of multiple layers and the placement member is disposed on a different layer of the first substrate than the outer conductive trace;
 wherein the embedded conductive trace is partially embedded in the first substrate and is disposed on the same surface of the same layer of the first substrate as the outer conductive trace;
 wherein the material of the frame is an iron-based alloy with nickel and cobalt.

2. A thermoelectric element-containing package according to claim 1, wherein the first substrate has a lowered portion that is recessed toward the plurality of thermoelectric elements and located in an outer circumferential portion of the first main surface, and the outer conductive trace is disposed on a surface of the lowered portion.

3. A thermoelectric element-containing package according to claim 1, wherein, when the placement member is disposed on the first substrate, the first substrate has a protruding portion that is formed in a position farther from the plurality of thermoelectric elements than the placement member, and the outer conductive trace is disposed on a surface of the protruding portion.

4. A thermoelectric element-containing package according to claim 1, wherein the first substrate, the second substrate, and the frame are formed of the same material.

5. A thermoelectric element-containing package according to claim 1, wherein the thermal conductivity of the frame is smaller than the thermal conductivity of the first substrate and the thermal conductivity of the second substrate.

6. A thermoelectric element-containing package according to claim 1, wherein the second substrate has a side surface bordering the third main surface and the fourth main surface, and the side surface of the second substrate is surrounded by the frame and joined to an inner circumferential surface of the frame.

7. A thermoelectric element-containing package according to claim 1, wherein the second substrate includes:
- an additional inner conductive trace that is disposed on the third main surface and connected to the thermoelectric elements;
- an additional outer conductive trace disposed on the fourth main surface so as to be exposed to the outside;
- an additional embedded conductive trace that is embedded in the second substrate and connected to the additional outer conductive trace; and
- a third via conductor that penetrates the second substrate so as to extend between the additional inner conductive trace and the additional embedded conductive trace, the third via conductor electrically connecting the additional inner conductive trace to the additional embedded conductive trace.

\* \* \* \* \*